United States Patent
Clark

(10) Patent No.: US 8,097,300 B2
(45) Date of Patent: Jan. 17, 2012

(54) METHOD OF FORMING MIXED RARE EARTH OXYNITRIDE AND ALUMINUM OXYNITRIDE FILMS BY ATOMIC LAYER DEPOSITION

(75) Inventor: Robert D. Clark, San Marcos, CA (US)

(73) Assignee: Tokyo Electron Limited, Tokyo (JP)

( * ) Notice: Subject to any disclaimer, the term of this patent is extended or adjusted under 35 U.S.C. 154(b) by 465 days.

(21) Appl. No.: 11/278,396

(22) Filed: Mar. 31, 2006

(65) Prior Publication Data

US 2007/0237699 A1    Oct. 11, 2007

(51) Int. Cl.
  C23C 16/00    (2006.01)
  C23C 16/40    (2006.01)
  C01F 17/00    (2006.01)
  C01F 7/00     (2006.01)
(52) U.S. Cl. .............. 427/255.19; 423/263; 423/600
(58) Field of Classification Search .......... 427/248.1, 427/250, 255.19; 423/600, 263
  See application file for complete search history.

(56) References Cited

U.S. PATENT DOCUMENTS

| | | | |
|---|---|---|---|
| 5,888,870 A | 3/1999 | Gardner et al. | |
| 6,200,898 B1 | 3/2001 | Tu | |
| 6,511,925 B1 | 1/2003 | Aronowitz et al. | |
| 6,730,164 B2 | 5/2004 | Vaartstra et al. | |
| 6,858,546 B2 | 2/2005 | Niinisto et al. | |
| 6,914,312 B2 | 7/2005 | Nishikawa et al. | |
| 7,122,464 B2 | 10/2006 | Vaartstra | |
| 7,312,139 B2 | 12/2007 | Wang et al. | |
| 7,378,129 B2 | 5/2008 | Kraus et al. | |
| 7,456,064 B2 | 11/2008 | Manchanda et al. | |
| 7,488,655 B2 | 2/2009 | Hayashi et al. | |

(Continued)

FOREIGN PATENT DOCUMENTS

| EP | 1548839 | 6/2005 |
|---|---|---|
| JP | 05024931 | 2/1993 |
| JP | 11168096 | 6/1999 |
| KR | 20060012926 A | 2/2006 |
| WO | 2004053997 A1 | 6/2004 |
| WO | 20050065402 A1 | 7/2005 |

OTHER PUBLICATIONS

European Patent Office, Invitation to Pay Additional Fees received in related PCT Application No. PCT/US2007/065342 dated Jul. 23, 2007, 7 pp.

(Continued)

*Primary Examiner* — Stanley Silverman
*Assistant Examiner* — Anthony J Zimmer
(74) *Attorney, Agent, or Firm* — Wood, Herron & Evans, LLP

(57) ABSTRACT

A method is provided for depositing a gate dielectric that includes at least two rare earth metal elements in the form of an oxynitride or an aluminum oxynitride. The method includes disposing a substrate in a process chamber and exposing the substrate to a gas pulse containing a first rare earth precursor and to a gas pulse containing a second rare earth precursor. The substrate may also optionally be exposed to a gas pulse containing an aluminum precursor. Sequentially after each precursor gas pulse, the substrate is exposed to a gas pulse of an oxygen-containing gas, nitrogen-containing gas or an oxygen- and nitrogen-containing gas. In alternative embodiments, the first and second rare earth precursors may be pulsed together, and either or both may be pulsed together with the aluminum precursor. The first and second rare earth precursors comprise a different rare earth metal element. The sequential exposing steps may be repeated to deposit a mixed rare earth oxynitride or aluminum oxynitride layer with a desired thickness. Purge or evacuation steps may also be performed after each gas pulse.

25 Claims, 13 Drawing Sheets

U.S. PATENT DOCUMENTS

| | | |
|---|---|---|
| 2002/0135030 A1 | 9/2002 | Horikawa |
| 2003/0045080 A1 | 3/2003 | Visokay et al. |
| 2003/0060003 A1 | 3/2003 | Hecht et al. |
| 2003/0072882 A1 | 4/2003 | Niinisto et al. |
| 2003/0168697 A1 | 9/2003 | Tamura et al. |
| 2003/0183885 A1 | 10/2003 | Nishikawa et al. |
| 2004/0051126 A1 | 3/2004 | Cuchiaro et al. |
| 2004/0123803 A1 | 7/2004 | Strang |
| 2004/0129969 A1 | 7/2004 | Colombo et al. |
| 2004/0132315 A1* | 7/2004 | Chambers et al. ............ 438/763 |
| 2004/0157473 A1 | 8/2004 | Hayashi et al. |
| 2004/0191997 A1 | 9/2004 | Kawahara et al. |
| 2005/0064207 A1* | 3/2005 | Senzaki et al. ................ 428/446 |
| 2005/0104112 A1 | 5/2005 | Haukka et al. |
| 2005/0130442 A1 | 6/2005 | Visokay et al. |
| 2005/0136632 A1 | 6/2005 | Rotondaro et al. |
| 2005/0156155 A1 | 7/2005 | Atanackovic |
| 2005/0233156 A1 | 10/2005 | Senzaki et al. |
| 2005/0272196 A1 | 12/2005 | Wickramanayaka et al. |
| 2006/0054943 A1 | 3/2006 | Li et al. |
| 2006/0072281 A1 | 4/2006 | Nam et al. |
| 2006/0128092 A1 | 6/2006 | Rouse |
| 2006/0151823 A1 | 7/2006 | Govindarajan |
| 2006/0189154 A1 | 8/2006 | Ahn et al. |
| 2007/0004224 A1* | 1/2007 | Currie ........................... 438/778 |
| 2007/0077750 A1 | 4/2007 | Ma et al. |

OTHER PUBLICATIONS

European Patent Office, International Search Report and Written Opinion received in related PCT Application No. PCT/US2007/065342 dated Sep. 21, 2007, 18 pp.

European Patent Office, Invitation to Pay Additional Fees received in related PCT Application No. PCT/US2007/065331 dated Sep. 9, 2007, 7 pp.

European Patent Office, International Search Report and Written Opinion received in related PCT Application No. PCT/US2007/065331 dated Dec. 17, 2007, 17 pp.

European Patent Office, International Search Report and Written Opinion received in related PCT Application No. PCT/US2007/065024 dated Aug. 20, 2007, 8 pp.

European Patent Office, International Search Report and Written Opinion received in related PCT Application No. PCT/US2007/065323 dated Aug. 17, 2007, 10 pp.

U.S. Patent and Trademark Office, Non-final Office Action received in related U.S. Appl. No. 11/278,399 dated Jan. 10, 2008, 25 pp.

Myllymaki et al., High-permittivity YScO3 Thin Films by Atomic Layer Deposition Using Two Precursor Approaches, J. Mater Chem. R Soc. Chem, UK, vol. 16, No. 6; Feb. 14, 2006, pp. 563-569.

Ohmi et al., Electrical Characteristics of Rare-Earth Oxides Stacked-layer Structures, Gate Insulator, IWGI, Nov. 6, 2003, pp. 28-31.

Nakagawa et al., Magnetocaloric effects of binary rare earth mononitrides, GdxTb1-xN and TbxHo1-xN; Journal of Alloys and Compounds, Feb. 9, 2006, pp. 187-190, vol. 408-412, Elsevier, Sequoia, Lausanne, Switzerland.

S.A. Shelvin et al, Ab initio design of high-k dielectric: LaxY103; Abstract, Physical Review Letters APS USA, vol. 94, No. 14, Apr. 13, 2005, 1 pg.

European Patent Office, Invitation to Pay Additional Fees including partial Search Report received in corresponding PCT Application No. PCT/US2007/065015, dated Sep. 20, 2007, 7 pgs.

European Patent Office, International Search Report and Written Opinion received in corresponding PCT Application No. PCT/US2007/065015, dated Nov. 30, 2007, 19 pgs.

U.S. Patent and Trademark Office, Non-Final Office Action received in related U.S. Appl. No. 11/537,492 dated Dec. 1, 2008, 19 pp.

Schlom, Darrel G. et al., Gate Oxides Beyond SiO2, MRS Bulletin vol. 33, Nov. 2008, www.mrs.org/bulletin, pp. 1017-1025.

U.S. Patent and Trademark Office, Non-Final Office Action received in related U.S. Appl. No. 11/537,245 dated Oct. 17, 2008, 17 pp.

U.S. Patent and Trademark Office, Non-Final Office Action received in related U.S. Appl. No. 11/278,397 dated Sep. 4, 2008, 23 pp.

U.S. Patent and Trademark Office, Non-Final Office Action received in related U.S. Appl. No. 11/278,399 dated Sep. 2, 2008, 18 pp.

European Patent Office, International Search Report and Written Opinion received in related International Application No. PCT/US2007/079681 dated Sep. 1, 2008, 13 pp.

U.S. Patent and Trademark Office, Non-Final Office Action received in related U.S. Appl. No. 11/278,393 dated Aug. 22, 2008, 21 pp.

U.S. Patent and Trademark Office, Non-Final Office Action received in related U.S. Appl. No. 11/278,387 dated Aug. 22, 2008, 23 pp.

Kim et al., Highly Conductive HfNx Films Prepared by Plasma-assisted Atomic Layer Deposition, Electromechanical and Solid-State Letters, 9 (8) C123-C125 (2006).

Xu et al., A Chemical Mechanism for Nitrogen Incorporation into HfO2 ALD Films Using Ammonia and Alkylamide As Precursors, Surface Science 591 (2005) L280-L285.

Xu et al., Atomic Layer Deposition of Hafnium Nitrides Using Ammonia and Alkylamide Precursors, Chemical Physics Letters 407 (2005) 272-275.

Becker et al., Atomic Layer Deposition of Insulating Hafnium and Zirconium Nitrides, Chem. Mater. 2004, 16, 3497-3501.

Niinisto et al., Advanced Electronic and Optoelectronic Materials by Atomic Layer Deposition: an Overview with Special Emphasis on Recent Progress in Processing of High-k Dielectrics and Other Oxide Materials, Phys. Stat. Sol. (A) 201, No. 7, 1443-1452 (2004).

U.S. Patent and Trademark Office, Final Office Action received in related U.S. Appl. No. 11/278,397 dated Mar. 10, 2009, 10 pp.

U.S. Patent and Trademark Office, Non-final Office Action received in related U.S. Appl. No. 11/537,245 dated Mar. 9, 2009, 19 pp.

U.S. Patent and Trademark Office, Final Office Action received in related U.S. Appl. No. 11/278,387 dated Apr. 3, 2009, 15 pp.

U.S. Patent and Trademark Office, Final Office Action received in related U.S. Appl. No. 11/278,393 dated Apr. 7, 2009, 17 pp.

U.S. Patent and Trademark Office, Advisory Action received in related U.S. Appl. No. 11/278,397 dated May 29, 2009, 6 pp.

U.S. Patent and Trademark Office, Final Office Action received in related U.S. Appl. No. 11/278,397 dated Mar. 10, 2009, 10 pp.

U.S. Patent and Trademark Office, Final Office Action received in related U.S. Appl. No. 11/278,399 dated Apr. 17, 2009, 26 pp.

U.S. Patent and Trademark Office, Non-Final Office Action received in related U.S. Appl. No. 11/537,245 dated Nov. 30, 2009, 15 pp.

U.S. Patent and Trademark Office, Non-Final Office Action received in related U.S. Appl. No. 11/278,387 dated Sep. 4, 2009, 8 pp.

U.S. Patent and Trademark Office, Non-Final Office Action received in related U.S. Appl. No. 11/278,393 dated Oct. 7, 2009, 9 pp.

U.S. Patent and Trademark Office, Non-Final Office Action received in related U.S. Appl. No. 11/278,399 dated Sep. 22, 2009, 22 pp.

U.S. Patent and Trademark Office, Final Office Action received in related U.S. Appl. No. 11/537,245 dated Aug. 6, 2009, 12 pp.

Wang et al., Atomic Layer Deposition of Lanthanum-Based Ternary Oxides, Electrochemical and Solid State Letters, 12 (4) G13-G15 (2009).

European Patent Office, Search Report and Written Opinion received in related PCT/US2007/065015 dated Sep. 30, 2008, 11 pp.

Ovanesyan et al., Single Crystal Growth and Characterization of LaLu03, Optical Materials 10 (1998) 291-295.

Xue et al., Dielectric Constants of Binary Rare-Earth Compounds, J. Phys.: Condens. Matter 12 (2000) 3113-3118.

Schlom et al., A Thermodynamic Approach to Selecting Alternative Gate Dielectrics, MRS Bulletin, Mar. 2002.

Leskela et al., Rare-Earth Oxide Thin Films as Gate Oxides in MOSFET Transistors, Journal of Solid State Chemistry 171 (2003) 170-174.

Robertson, High Dielectric Constant Oxides, Eur. Phys. J. Appl. Phys. 28, 265-291 (2004).

Zhao et al., Ternary Rare-Earth Metal Oxide High-k Layers on Silicon Oxide, Applied Physics Letters 86, 132903 (2005.

Schlom, High-k Candidates for Use as the Gate Dielectric in Silicon Mosfets, Thin Films and Heterostructures for Oxide Electronics, Chapter 2, pp. 31-78, 2005.

U.S. Patent and Trademark Office, Final Office Action, received in related U.S. Appl. No. 11/278,393 dated Apr. 1, 2010, 20 pp.

U.S. Patent and Trademark Office, Final Office Action, received in related U.S. Appl. No. 11/278,399 dated Feb. 24, 2010, 52 pp.

U.S. Patent and Trademark Office, Non-Final Office Action, received in related U.S. Appl. No. 11/278,397 dated Feb. 4, 2010, 15 pp.

Kosola A et al: "Neodymium oxide and neodymium aluminate thin films by atomic layer deposition" Thin Solid Films, vol. 479, No. 1-2, Jan. 5, 2005, pp. 152-159, XP004807814 Elsevier-Sequoia S.A. Lausanne [CH] ISSN: 0040-6090.

European Patent Office, Communication Pursuant to Article 94(3) EPC, received in corresponding European Application No. 07 759 461.2, dated Apr. 7, 2010, 4 pp.

State Intellectual Property Office of the People's Republic of China, The First Office Action, received in corresponding Chinese Application No. 200780020120.6, dated May 13, 2010, 14 pp.

U.S. Patent and Trademark Office, Office Action, in Application U.S. Appl. No. 12/781,402, dated Jan. 26, 2011.

U.S. Patent and Trademark Office, Non-final Office Action received in related U.S. Appl. No. 11/278,393 dated Dec. 23, 2010.

U.S. Patent and Trademark Office, Advisory Action received in related U.S. Appl. No. 11/278,393 dated Jul. 2, 2010.

U.S. Patent and Trademark Office, Office Action received in related U.S. Appl. No. 11/278,387 dated May 13, 2010.

U.S. Patent and Trademark Office, Notice of Allowance received in related U.S. Appl. No. 11/278,397 dated Jul. 23, 2010.

U.S. Patent and Trademark Office, Notice of Allowance received in related U.S. Appl. No. 11/278,399 dated May 7, 2010.

U.S. Patent and Trademark Office, Notice of Allowance received in related U.S. Appl. No. 11/537,245 dated May 3, 2010.

European Patent Office, Communication Pursuant to Article 94(3) EPC, European Application No. 07 759 461.2, dated Oct. 22, 2010.

U.S. Patent and Trademark Office, Notice of Allowance received in related U.S. Appl. No. 11/278,393, dated May 27, 2011, 12 pp.

Taiwan Intellectual Property Office, Office Action issued in related TW Application No. 096110749 issued Jun. 21, 2011, 17 pp.

Taiwan Intellectual Property Office, Office Action issued in related TW Application No. 096110730 issued Jun. 21, 2011, 17 pp.

State Intellectual Property Office of China, Notice of Allowance issued in corresponding Chinese Application No. 200780020120.6, dated Jun. 23, 2011, 6 pp.

Taiwan Intellectual Property Office, Office Action issued in related TW Application No. 096110747 issued Jul. 7, 2011, 9 pp.

* cited by examiner

METHOD OF FORMING MIXED RARE EARTH OXYNITRIDE AND ALUMINUM OXYNITRIDE FILMS BY ATOMIC LAYER DEPOSITION

CROSS-REFERENCE TO RELATED APPLICATIONS

This application is related to co-pending U.S. patent application Ser. No. 11/278,387, entitled "METHOD OF FORMING MIXED RARE EARTH OXIDE AND ALUMINATE FILMS BY ATOMIC LAYER DEPOSITION," filed on even date herewith; co-pending U.S. patent application Ser. No. 11/278,393, entitled "METHOD OF FORMING MIXED RARE EARTH NITRIDE AND ALUMINUM NITRIDE FILMS BY ATOMIC LAYER DEPOSITION," filed on even date herewith; co-pending U.S. patent application Ser. No. 11/278,397, entitled "SEMICONDUCTOR DEVICE WITH GATE DIELECTRIC CONTAINING MIXED RARE EARTH ELEMENTS," filed on even date herewith; and co-pending U.S. patent application Ser. No. 11/278,399, entitled "SEMICONDUCTOR DEVICE WITH GATE DIELECTRIC CONTAINING ALUMINUM AND MIXED RARE EARTH ELEMENTS," filed on even date herewith. The entire contents of these applications are herein incorporated by reference in their entirety.

FIELD OF INVENTION

The present invention relates to a method of forming dielectric materials for semiconductor manufacturing, and more particularly to a method of forming high dielectric constant mixed rare earth oxynitride and aluminum oxynitride films containing a plurality of different rare earth metal elements.

BACKGROUND OF THE INVENTION

High dielectric constant (high-k) materials are desirable for use as capacitor dielectrics and for use as gate dielectrics in future generations of electronic devices. The first high-k materials used as capacitor dielectrics were tantalum oxide and aluminum oxide materials. Currently, mixed hafnium aluminum oxide materials are being implemented as capacitor dielectrics in DRAM production. Similarly, hafnium-based dielectrics are expected to enter production as gate dielectrics, thereby replacing the current silicon oxide and silicon oxynitride materials.

The most common methods of depositing high-k dielectrics include physical vapor deposition (PVD), chemical vapor deposition (CVD) and atomic layer deposition (ALD). The advantages of using ALD over PVD and CVD methods include improved thickness control for thin films, improved uniformity across the wafer and improved conformality over high aspect ratio structures.

The atomic layer deposition process includes introducing separate pulses of reactive vapor streams to a process chamber containing a substrate, where the pulses can be separated by either purging or evacuating. During each pulse, a self-limited chemisorbed layer is formed on the surface of the wafer, which layer then reacts with the component included in the next pulse. Purging or evacuation between each pulse is used to reduce or eliminate gas phase mixing of the reactive vapor streams. The typical ALD process results in well-controlled sub-monolayer or near monolayer growth per cycle.

One representative case of ALD is deposition of aluminum (Al) oxide from trimethylaluminum and water. In this ALD process, a pulse of trimethylaluminum will react with hydroxyl groups on the surface of a heated substrate to form a chemisorbed layer of methyl-aluminum moieties that are self-limited to less than a monolayer. The reaction chamber is then purged or evacuated to remove unreacted trimethylaluminum as well as any vapor phase reaction by-products. A pulse of water vapor is then introduced which reacts with the surface aluminum-methyl bonds and regenerates a hydroxylated surface. By repeating the above deposition cycle it is possible to realize layer by layer film growth of about 1 angstrom ($10^{-10}$ m) per cycle. By selecting different reactive precursors and gases, it is possible to deposit many different types of films using ALD processes.

Current high-k dielectric materials under evaluation suffer from various problems. Some of the problems encountered include film crystallization during anneals, growth of interfacial layers during deposition and further processing, large densities of interface traps, reduced channel mobility, reaction with poly-silicon gates, and Fermi level pinning with metal gates. One strategy to mitigate these effects that has recently been proposed is to use mixed zirconium (Zr) and hafnium (Hf) oxides as high-k dielectrics. Some of the benefits of these dielectrics include increased thermal stability and improved electrical properties compared with pure Zr oxide or pure Hf oxide. While all of the factors contributing to these improvements are not known, the use of the mixed Zr and Hf oxides is facilitated by the similar chemical properties of zirconium and hafnium, and by the infinite miscibility of zirconium and hafnium oxides. Other problems encountered with current high-k dielectric materials include dielectric constants that are too low compared to desired values for advanced semiconductor devices. Additionally, the dielectric constant may be further reduced by the presence of an interfacial layer between the high-k dielectric material and the underlying substrate.

Accordingly, there is a need for further developments for forming high-k dielectric materials to be used as gate dielectrics in semiconductor devices, such as capacitors and transistors.

SUMMARY OF THE INVENTION

Embodiments of the invention provide a method for depositing mixed rare earth nitride and aluminum nitride films by ALD and plasma enhanced ALD (PEALD). The mixed rare earth oxynitride and aluminum oxynitride films contain a mixture of a plurality of different rare earth metal elements, including Y, Lu, La, Ce, Pr, Nd, Sm, Eu, Gd, Tb, Dy, Ho, Er, Tm, and Yb. For example, the mixed rare earth oxynitride and aluminum oxynitride films may be used in advanced semiconductor applications that include future generations of high-k dielectric materials for use as both capacitor and gate dielectrics.

According to one embodiment of the invention, a method is provided for forming a mixed rare earth oxide film or a mixed rare earth aluminate film by disposing a substrate in a process chamber, and exposing the substrate to a gas pulse sequence to deposit a mixed rare earth oxide film or a mixed rare earth aluminate film with a desired thickness. The gas pulse sequence includes, in any order: a) sequentially first, exposing the substrate to a gas pulse containing a first rare earth precursor, and second, exposing the substrate to a gas pulse containing an oxygen-containing gas; b) sequentially first, exposing the substrate to a gas pulse containing a second rare earth precursor, and second, exposing the substrate to a gas pulse containing an oxygen-containing gas, where the first and second rare earth precursors each contain a different rare earth metal element; and optionally, c) sequentially first, exposing the substrate to a gas pulse containing an aluminum precursor and second, exposing the substrate to a gas pulse containing the oxygen-containing gas. The method further includes each of a), b) and optionally c) being optionally repeated any number of desired times, and the gas pulse sequence including a), b) and optionally c) being optionally repeated, in any order, any number of desired times to achieve the desired thickness. According to one embodiment of the invention, the method further includes purging or evacuating the process chamber after at least one of the exposing steps.

According to another embodiment of the invention, a method is provided for forming a mixed rare earth oxynitride film by a) disposing a substrate in a process chamber, b) sequentially exposing the substrate to a gas pulse comprising a plurality of rare earth precursors each containing a different rare earth metal element, c) exposing the substrate to a pulse containing an oxygen-, nitrogen-, or oxygen- and nitrogen-containing gas, and d) repeating steps b) and c) a desired number of times to deposit a mixed rare earth oxynitride film with a desired thickness. According to one embodiment of the invention, the method further includes purging or evacuating the process chamber after at least one of the exposing steps. According to another embodiment of the invention, the gas pulse of step b) includes an aluminum precursor, whereby a mixed rare earth aluminum oxynitride film is formed. According to an alternate embodiment, after steps b) and c) are performed, the substrate is exposed to another pulse sequence including exposure to an aluminum precursor followed by exposure to an oxygen-, nitrogen-, or oxygen- and nitrogen-containing gas, whereby a mixed rare earth aluminum oxynitride film is formed.

DETAILED DESCRIPTION OF SEVERAL EMBODIMENTS

Figure 1A:
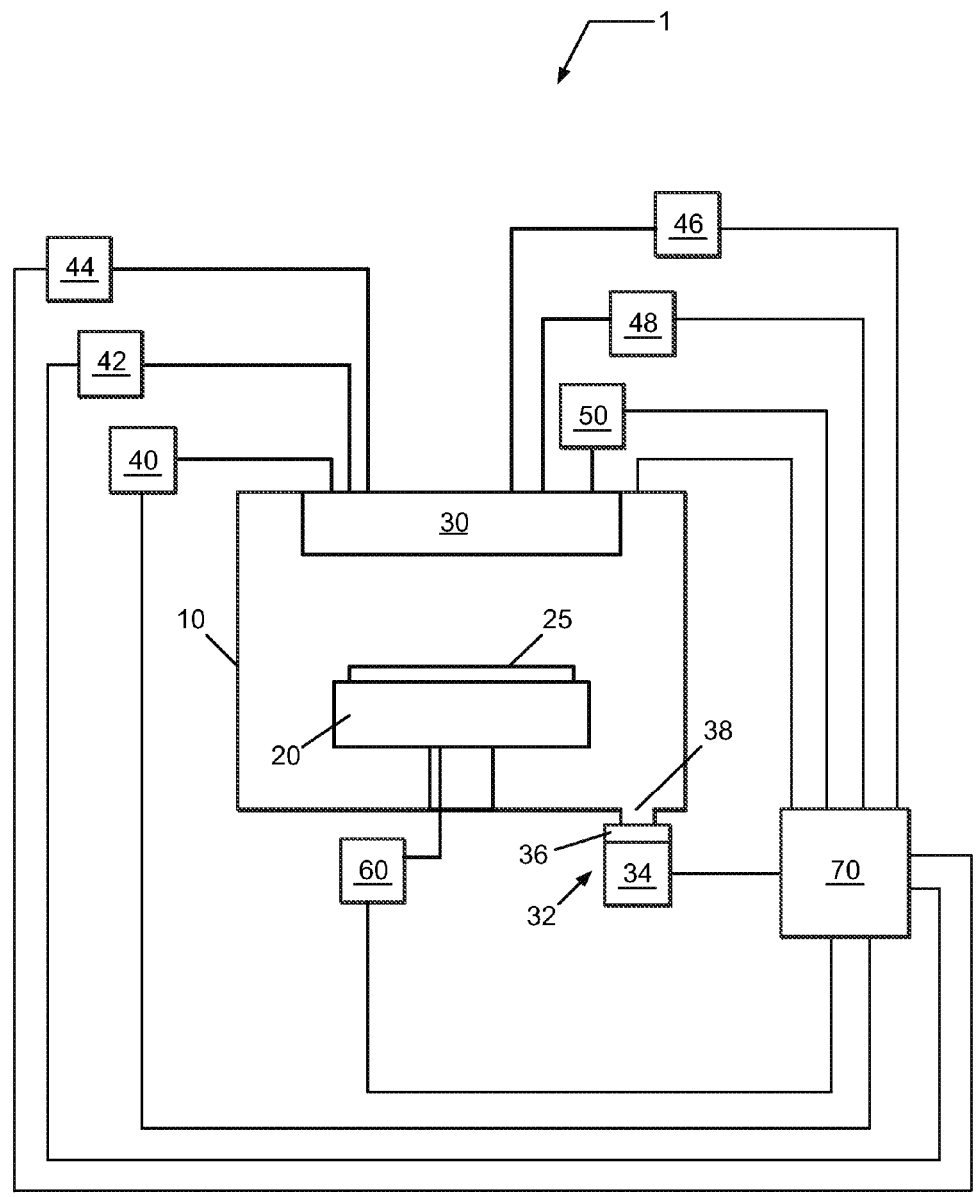
FIG. 1A depicts a schematic view of an ALD system in accordance with an embodiment of the invention.

As in the case of mixed Zr/Hf oxide based materials, mixed rare earth based materials are likely to provide beneficial thermal and electrical characteristics for future high-k applications in semiconductor applications. As used herein, mixed rare earth based materials refer to materials containing a plurality of, i.e., at least two, different rare earth metal elements. Because the rare earth elements are chemically similar and practically infinitely miscible as oxides, nitrides, oxynitrides, aluminates, aluminum nitrides, and aluminum oxynitrides, they are expected to form highly stable solid solutions with other rare earth elements. Expected benefits of a film containing a mixed rare earth based material incorporating a plurality of rare earth metal elements include increased thermal stability in contact with silicon or metal gate electrode material, increased crystallization temperature, increased dielectric constant compared to rare earth based materials containing a single rare earth metal element, decreased density of interface traps, decreased threshold voltage shifts and Fermi level pinning, and improved processing characteristics. For example, the mixed rare earth based films can be used in applications that include future generations of high-k dielectric materials for use as both capacitor and transistor gate dielectrics.

Incorporation of aluminum into a mixed rare earth oxide based material to form an aluminate structure provides increased thermal stability in contact with silicon as well as larger band gap to reduce leakage. Other benefits include increase in the dielectric constant over that of rare earth aluminates containing only one rare earth metal element. It is contemplated that there may be compositional ranges of mixed rare earth aluminate films using rare earth elements of differing atomic sizes that may provide significantly higher dielectric constants due to the increased polarizability that can be realized from a size mismatch between the two rare earth metal ions (e.g., lanthanum (La) mixed with lutetium (Lu) aluminate).

Nitrogen incorporation into gate dielectric materials may provide several advantages. In some cases, improved electrical characteristics have been reported. In addition, nitrogen doped dielectrics tend to remain amorphous to higher temperatures than the pure oxide materials. Nitrogen incorporation has the additional benefits of slightly increasing the dielectric constant of the material and suppressing dopant diffusion through the material. Finally, nitrogen incorporation can help suppress interface layer growth during the film deposition and subsequent processing steps.

Embodiments of the invention provide a method for forming mixed rare earth based films that can be uniformly deposited with excellent thickness control over high aspect ratios that are envisioned in future DRAM and logic generations. Because CVD and PVD methods of depositing high-k films are not expected to provide the needed conformality and atomic layer control over the deposition rate, ALD and PEALD methods of depositing the high-k materials will be required for use in future generations of integrated circuits.

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Referring now to the drawings, FIG. 1A illustrates an ALD system 1 for depositing mixed rare earth based films on a substrate according to one embodiment of the invention. The ALD system 1 includes a process chamber 10 having a substrate holder 20 configured to support a substrate 25, upon which the mixed rare earth based film is formed. The process chamber 10 further contains an upper assembly 30 (e.g., a showerhead) coupled to a first process material supply system 40, a second process material supply system 42, a purge gas supply system 44, an oxygen-containing gas supply system 46, a nitrogen-containing gas supply system 48, and an aluminum-containing gas supply system 50. Additionally, the ALD system 1 includes a substrate temperature control system 60 coupled to substrate holder 20 and configured to elevate and control the temperature of substrate 25. Furthermore, the ALD system 1 includes a controller 70 that can be coupled to process chamber 10, substrate holder 20, assembly 30 configured for introducing process gases into the process chamber 10, first process material supply system 40, second process material supply system 42, purge gas supply system 44, oxygen-containing gas supply system 46, nitrogen-containing gas supply system 48, aluminum-containing gas supply system 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 1A, singular processing elements (10, 20, 30, 40, 42, 44, 46, 48, 50, and 60) are shown, but this is not required for the invention. The ALD system 1 can include any number of processing elements having any number of controllers associated with them in addition to independent processing elements.

The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1A, the ALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch ALD system capable of processing multiple substrates simultaneously may be utilized for depositing the mixed rare earth based films described in the embodiments of the invention.

The first process material supply system 40 and the second process material supply system 42 are configured to alternately or simultaneously introduce a first and second rare earth precursor to process chamber 10, where the first and second rare earth precursors contains different rare earth metal elements. The alternation of the introduction of the first and second rare earth precursors can be cyclical, or it may be a cyclical with variable time periods between introduction of the first and second materials. Furthermore, each of the first process material supply system 40 and the second process material supply system 42 may each be configured to alternately or simultaneously introduce a plurality of rare earth precursors to the process chamber 10, where the plurality of rare earth precursors contain different rare earth metal elements.

According to embodiments of the invention, several methods may be utilized for introducing the rare earth precursors to the process chamber 10. One method includes vaporizing rare earth precursors through the use of separate bubblers or direct liquid injection systems, or a combination thereof, and then mixing in the gas phase within or prior to introduction into the process chamber 10. By controlling the vaporization rate of each precursor separately, a desired rare earth metal element stoichiometry can be attained within the deposited film. Another method of delivering each rare earth precursor includes separately controlling two or more different liquid sources, which are then mixed prior to entering a common vaporizer. This method may be utilized when the precursors are compatible in solution or in liquid form and they have similar vaporization characteristics. Other methods include the use of compatible mixed solid or liquid precursors within a bubbler. Liquid source precursors may include neat liquid rare earth precursors, or solid or liquid rare earth precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that a plurality of different rare earth elements may be included in this scheme by including a plurality of rare earth precursors within the deposited film. It will also be apparent to one skilled in the art that by controlling the relative concentration levels of the various precursors within a gas pulse, it is possible to deposit mixed rare earth based films with desired stoichiometries.

Embodiments of the inventions may utilize a wide variety of different rare earth precursors. For example, many rare earth precursors have the formula:

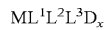

$$ML^1L^2L^3D_x$$

where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1, L^2, L^3$ are individual anionic ligands, and D is a neutral donor ligand where x can be 0, 1, 2, or 3. Each $L^1, L^2, L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyrroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis (trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrrolidine, triethylamine, trimethylamine, acetonitrile, and 2,2-dimethylpropionitrile.

Representative examples of rare earth precursors include:

Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 1A, the oxygen-containing gas supply system 46 is configured to introduce an oxygen-containing gas to the process chamber 10. The oxygen-containing gas can include $O_2$, $H_2O$, or $H_2O_2$, or a combination thereof, and optionally an inert gas such as Ar. Similarly, the nitrogen-containing gas supply system 48 is configured to introduce a nitrogen-containing gas to the process chamber 10. The nitrogen-containing gas can include $NH_3$, $N_2H_4$, or a combination thereof, and optionally an inert gas such as Ar. According to one embodiment of the invention, the oxygen-containing gas or the nitrogen-containing gas can include NO, $NO_2$, or $N_2O$, or a combination thereof, and optionally an inert gas such as Ar.

Embodiments of the invention may utilize a wide variety of aluminum precursors for incorporating aluminum into the mixed rare earth based films. For example, many aluminum precursors have the formula:

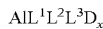

$$AlL^1L^2L^3D_x$$

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Other examples of aluminum precursors include: $Al_2Me_6$, $Al_2Et_6$, $[Al(O(sBu))_3]_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Still referring to FIG. 1A, the purge gas supply system 44 is configured to introduce a purge gas to process chamber 10. For example, the introduction of purge gas may occur between introduction of pulses of rare earth precursors and an oxygen-containing gas, a nitrogen-containing gas, or an aluminum precursor to the process chamber 10. The purge gas can comprise an inert gas, such as a noble gas (i.e., He, Ne, Ar, Kr, Xe), nitrogen ($N_2$), or hydrogen ($H_2$).

Furthermore, ALD system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the processing chamber 10 and any other component within the ALD system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular mixed rare earth based material on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas delivery system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.). The pressure control system 32 can, for example, be configured to control the process chamber pressure between about 0.1 Torr and about 100 Torr during deposition of the mixed rare earth based materials.

The first material supply system 40, the second material supply system 42, the purge gas supply system 44, the oxygen-containing gas supply system 46, the nitrogen-containing gas supply system 48, and the aluminum-containing gas supply system 50 can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for rare earth precursors can be between 0.3 and 3 sec, for example 1 sec. Exemplary gas pulse lengths for aluminum precursors can be between 0.1 and 3 sec, for example 0.3 sec. Exemplary gas pulse lengths for oxygen- and nitrogen-containing gases can be between 0.3 and 3 sec, for example 1 sec. Exemplary purge gas pulse lengths can be between 1 and 20 sec, for example 3 sec. An exemplary pulsed gas injection system is described in greater detail in pending U.S. Patent Application Publication No. 2004/0123803.

Still referring to FIG. 1A, controller 70 can comprise a microprocessor, memory, and a digital I/O port capable of generating control voltages sufficient to communicate and activate inputs to the ALD system 1 as well as monitor outputs from the ALD system 1. Moreover, the controller 70 may be coupled to and may exchange information with the process chamber 10, substrate holder 20, upper assembly 30, first process material supply system 40, second process material supply system 42, purge gas supply system 44, oxygen-containing gas supply system 46, nitrogen-containing gas supply system 48, aluminum-containing gas supply system 50, substrate temperature control system 60, substrate temperature controller 60, and pressure control system 32. For example, a program stored in the memory may be utilized to activate the inputs to the aforementioned components of the ALD system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer program product may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the ALD system 1, or it may be remotely located relative to the ALD system 1. For example, the controller 70 may exchange data with the ALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the ALD system 1 via a wireless connection.

Figure 1B:
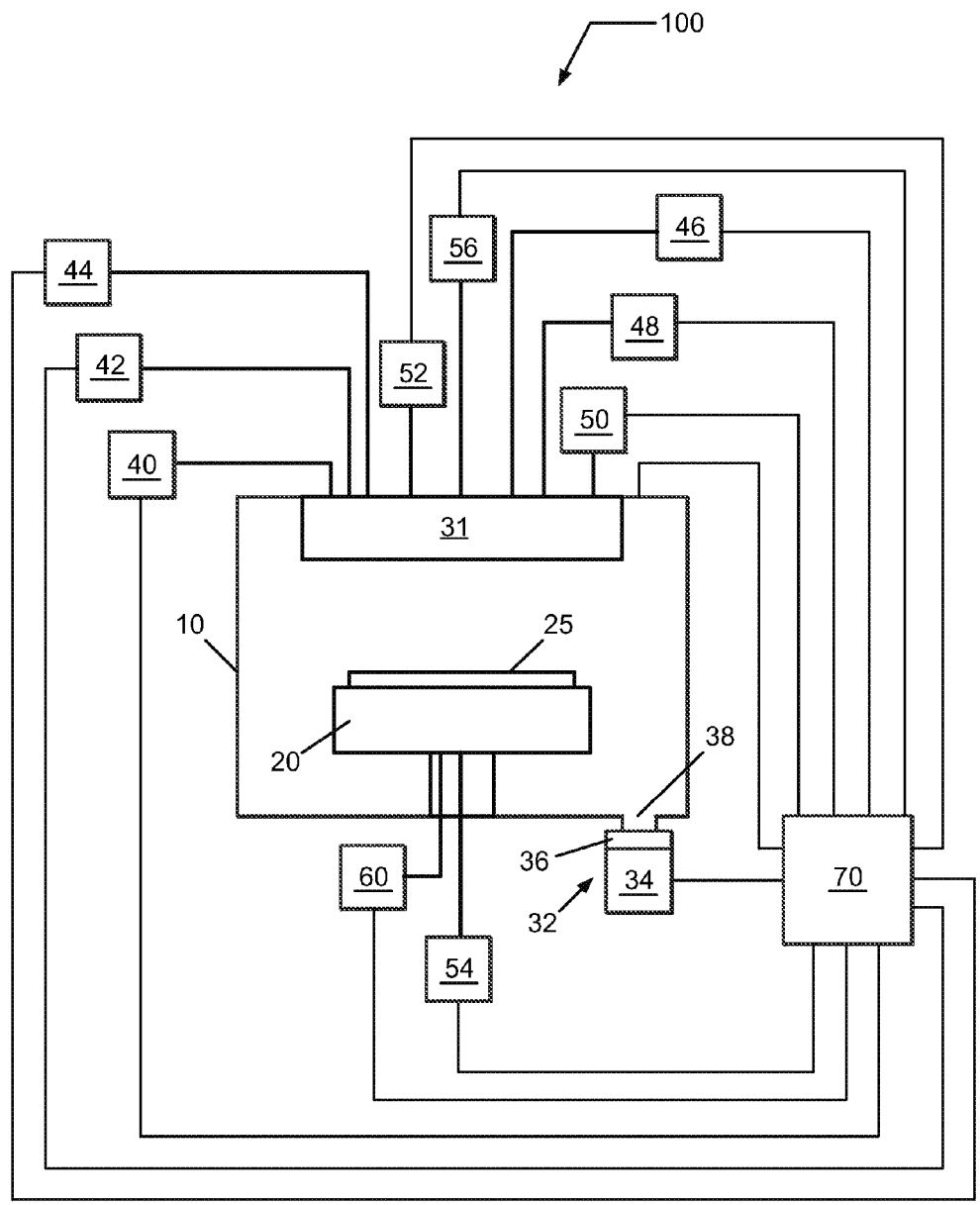
FIG. 1B depicts a schematic view of a PEALD system in accordance with an embodiment of the invention.

FIG. 1B illustrates a PEALD system 100 for depositing a mixed rare earth based film on a substrate according to an embodiment of the invention. The PEALD system 100 is similar to the ALD system 1 described in FIG. 1A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen gas containing $N_2$, $NH_3$, or $N_2H_4$, or a combination thereof, in the process chamber. Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the PEALD system 100 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1B as separate entities, they may indeed comprise one or more power sources coupled to substrate holder 20.

In addition, the PEALD system 100 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 25. The remote plasma system 56 can, for example, contain a microwave frequency generator. The process chamber pressure can be between about 0.1 Torr and about 10 Torr, or between about 0.2 Torr and about 3 Torr.

FIGS. 2A-2F schematically illustrate pulse sequences for forming mixed rare earth based films according to embodiments of the invention. According to embodiments of the invention, sequential and alternating pulse sequences are used to deposit the different components (i.e., rare earth metal elements, aluminum, oxygen, and nitrogen) of the mixed rare earth based films. Since ALD and PEALD processes typically deposit less than a monolayer of material per gas pulse, it is possible to form a homogenous material using separate deposition sequences of the different components of the film. Depending on the gas selections and combination of pulse sequences, mixed rare earth materials may be formed that include mixed rare earth oxide films, mixed rare earth nitride films, mixed rare earth oxynitride films, mixed rare earth aluminate films, mixed rare earth aluminum nitride films, and mixed rare earth aluminum oxynitride films.

Figure 2A:
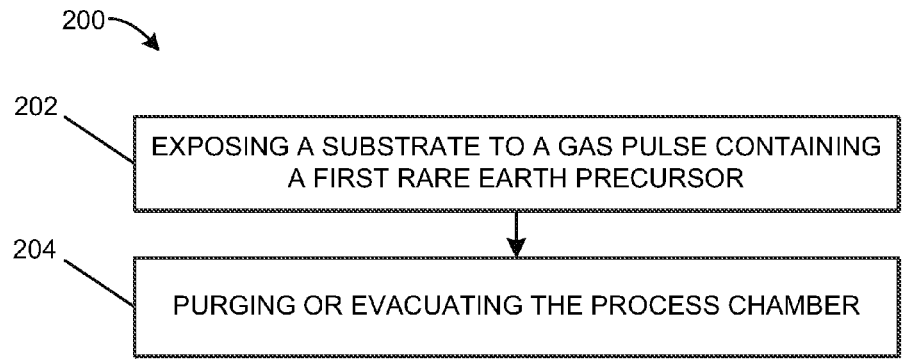
FIGS. 2A-2F schematically illustrate pulse sequences for forming mixed rare earth based films according to embodiments of the invention.
Figure 2B:
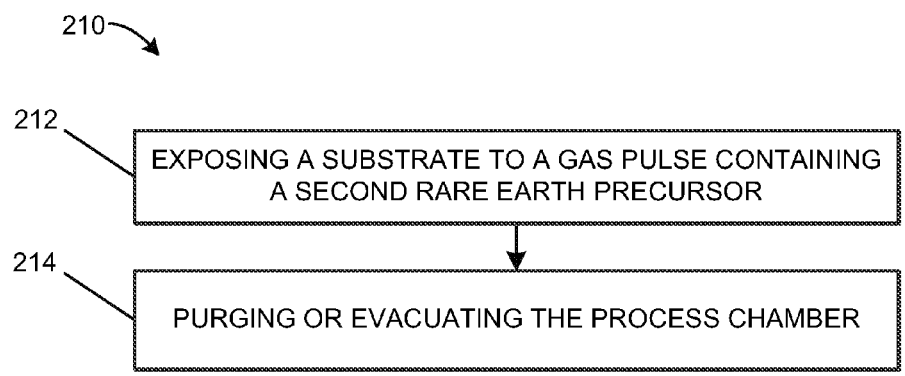
Figure 2C:
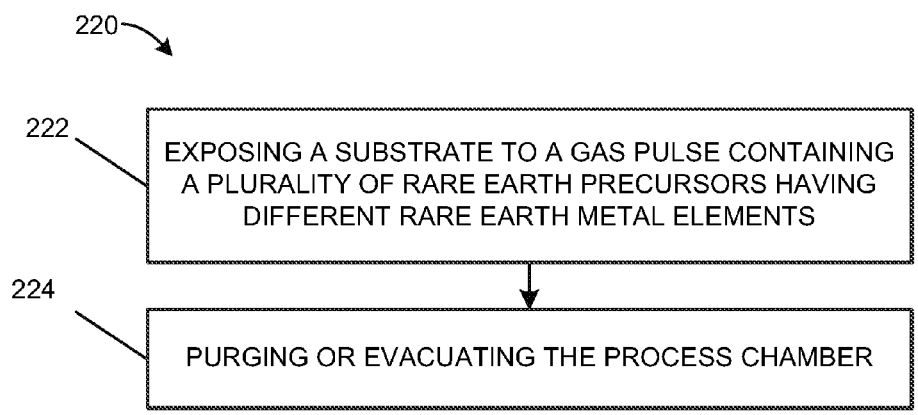
Figure 2D:
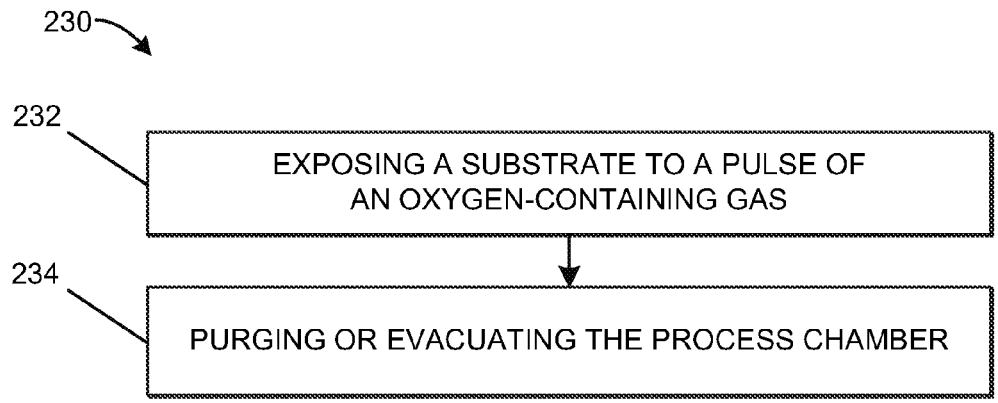
Figure 2E:
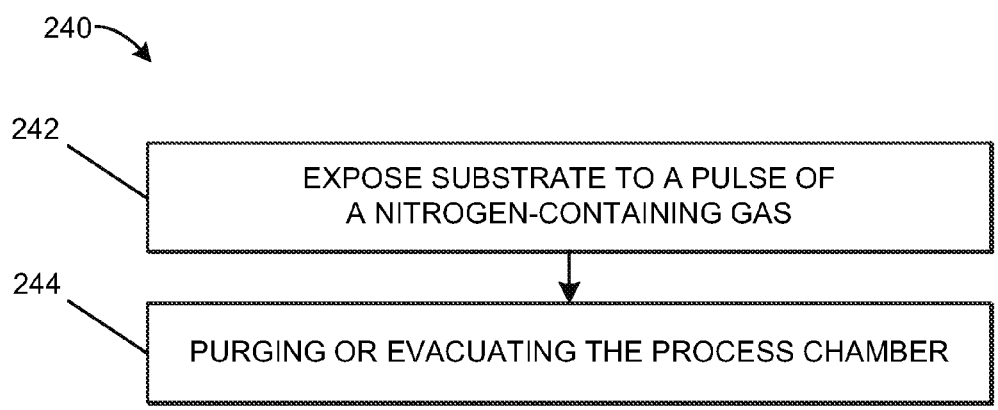
Figure 2F:
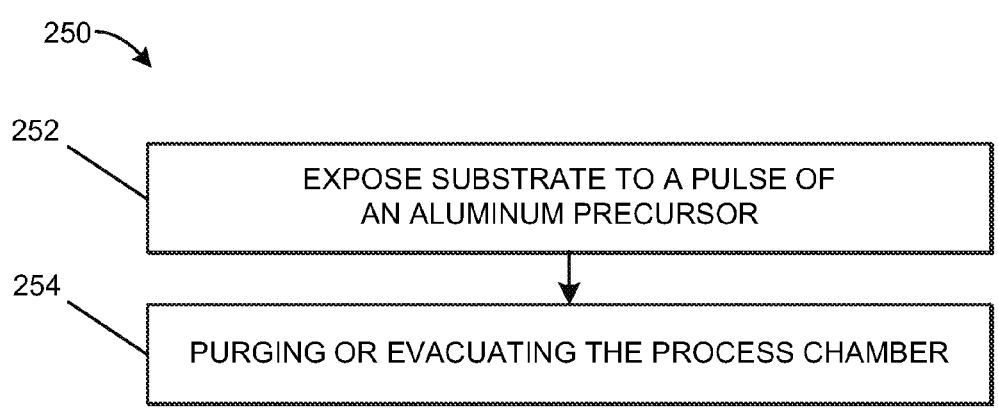

FIG. 2A depicts a pulse sequence 200 for depositing a first rare earth element from a first rare earth precursor in step 202. FIG. 2B depicts a pulse sequence 210 for depositing a second rare earth element from a second rare earth precursor in step 212. FIG. 2C depicts a pulse sequence 220 for simultaneously depositing a plurality of different rare earth elements from a plurality of rare earth precursors in step 222. FIG. 2D depicts a pulse sequence 230 for incorporating oxygen into a mixed rare earth based film from exposure to an oxygen-containing gas in step 232. FIG. 2E depicts a pulse sequence 240 for incorporating nitrogen into a mixed rare earth based film from exposure to a nitrogen-containing gas in step 242. FIG. 2F depicts a pulse sequence 250 for depositing aluminum from an aluminum precursor in step 252.

According to the embodiments depicted in FIGS. 2A-2F, each of the pulse sequences 200, 210, 220, 230, 240, and 250 may include a respective purge or evacuation step 204, 214, 224, 234, 244, 254 to remove unreacted gas or byproducts from the process chamber. According to another embodiment of the invention, one or more of the purge or evacuation steps 204, 214, 224, 234, 244, 254 may be omitted.

According to embodiments of the invention, different combinations of the pulse sequences depicted in FIGS. 2A-2F may be utilized for depositing different mixed rare earth based materials. Below are exemplary mixed rare earth based materials containing two different rare earth metal elements that may be deposited by the teachings of embodiments of the invention. As those skilled in the art will readily recognize, a wide variety of other mixed rare earth based materials not shown below may be deposited. Therefore, embodiments of the invention are not limited to the materials listed below. For example, other mixed rare earth based materials may contain more than two rare earth elements, for example three, four, or more.

Mixed Rare Earth Oxides: $La_xLu_yO_m$, $Y_xLu_yO_m$, $Y_xLa_yO_m$, $Nd_xLa_yO_m$, and $La_xPr_yO_m$.

Mixed Rare Earth Nitrides: $La_xLu_yN_n$, $Y_xLu_yN_n$, $Y_xLa_yN_n$, $Nd_xLa_yN_n$, and $La_xPr_yN_n$.

Mixed Rare Earth Oxynitrides: $La_xLu_yO_mN_n$, $Y_xLu_yO_mN_n$, $Y_xLa_yO_mN_n$, $Nd_xLa_yO_mN_n$, and $La_xPr_yO_mN_n$.

Mixed Rare Earth Aluminum Oxides: $La_xLu_yAl_aO_m$, $Y_xLu_yAl_aO_m$, $Y_xLa_yAl_aO_m$, $Nd_xLa_yAl_aO_m$, and $La_xPr_yAl_aO_m$.

Mixed Rare Earth Aluminum Nitrides: $La_xLu_yAl_aN_n$, $Y_xLu_yAl_aN_n$, $Y_xLa_yAl_aN_n$, $Nd_xLa_yAl_aN_n$, and $La_xPr_yAl_aN_n$.

Mixed Rare Earth Aluminum Oxynitrides: $La_xLu_yAl_aO_mN_n$, $Y_xLu_yAl_aO_mN_n$, $Y_xLa_yAl_aO_mN_n$, $Nd_xLa_yAl_aO_mN_n$, and $La_xPr_yAl_aO_mN_n$.

Mixed Rare Earth Oxide Films

Figure 3A:
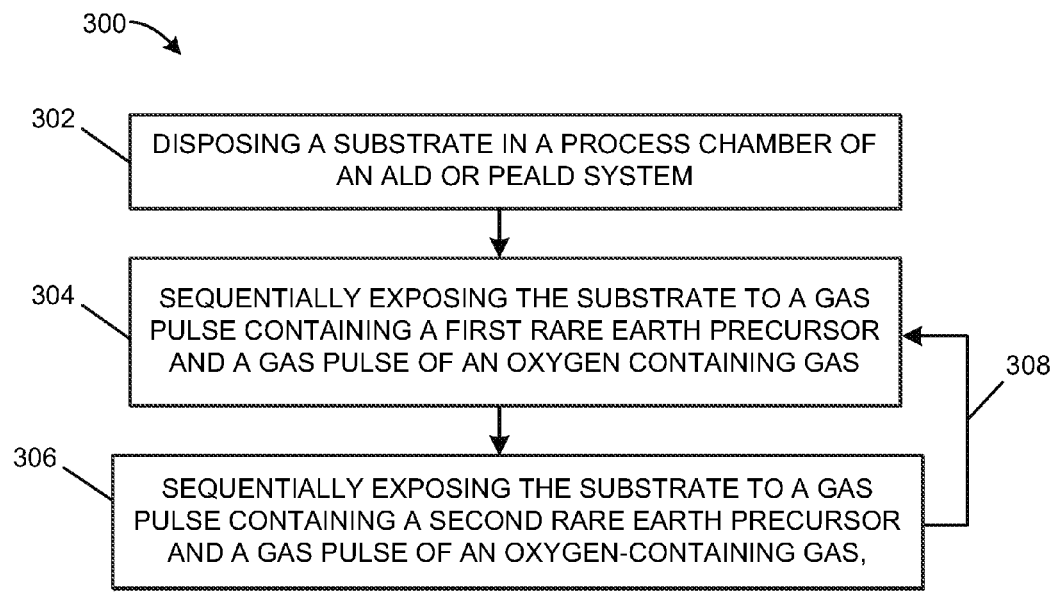
FIGS. 3A-3D are process flow diagrams for forming mixed rare earth oxide films according to embodiments of the invention.

FIGS. 3A-3D are process flow diagrams for forming mixed rare earth oxide films according embodiments of the invention. The process flows of FIGS. 3A-3D may be performed by the ALD/PEALD systems 1/101 of FIGS. 1, 2, or any other suitable ALD/PEALD systems configured to perform an ALD/PEALD process. In FIG. 3A, the process 300 begins when a substrate, such as a semiconductor substrate, is disposed in a process chamber of an ALD or PEALD system in step 302. In step 304, the substrate is sequentially exposed to a gas pulse containing a first rare earth precursor and a gas pulse of an oxygen-containing gas. In step 306, the substrate is sequentially exposed to a gas pulse of a second rare earth precursor and a gas pulse of an oxygen-containing gas. The oxygen-containing gas can include $O_2$, $H_2O$, $H_2O_2$, ozone, or plasma excited oxygen, or a combination thereof, and optionally an inert gas such as Ar.

In step 304, the first rare earth precursor reacts with hydroxyl groups on the surface of the heated substrate to form a chemisorbed layer less than a monolayer thick containing the first rare earth metal element. The chemisorbed layer is less than a monolayer thick due to the large size of the precursor compared to the size of the first rare earth metal element. Next, oxygen from the gas pulse of the oxygen-containing gas reacts with the chemisorbed surface layer and regenerates a hydroxylated surface. By repeating this sequential gas exposure, i.e., by alternating the two exposures a plurality of times, it is possible to achieve layer by layer growth of about 1 angstrom ($10^{-10}$ m) per cycle. As will be described below, according to another embodiment of the invention, the process chamber may be purged or evacuated to removing any unreacted first or second rare earth precursor, byproducts, and oxygen-containing gas from the process chamber between the sequential and alternating gas pulses.

According to embodiments of the invention, the first rare earth (RE1) precursor and the second rare earth (RE2) precursor contain different rare earth metal elements for forming mixed rare earth oxide films with a general chemical formula $RE1_xRE2_yO_m$, where x, y, and m are non-zero numbers. The sequential exposure steps 304 and 306 may be repeated a predetermined number of times, as shown by the process flow arrow 308, until a mixed rare earth oxide film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to the embodiment depicted in FIG. 3A, the process flow 300 includes a deposition cycle containing sequential and alternating exposures of a pulse of a first rare earth precursor, a pulse of an oxygen-containing gas, a pulse of a second rare earth precursor, and a pulse of an oxygen-containing gas. According to another embodiment of the invention, the order of the sequential and alternating exposure steps 304, 306 may be reversed, i.e., step 306 performed before step 304, to effect film growth and film composition.

According to one embodiment of the invention, each of the sequential exposure steps 304 and 306 may be independently repeated a predetermined number of times. In one example, if step 304 is denoted by pulse sequence A and step 306 is denoted by a pulse sequence B, a deposition cycle can include AB where AB may be repeated a predetermined number of times (i.e., ABABAB etc.) until the desired film is formed. As those skilled in the art will readily recognize, a wide variety of other deposition cycles are possible, including, for example, ABBABB, AABAAB, ABBB, AAAB, AABB, AAABB, etc. However, embodiments of the invention are not limited to these deposition cycles, as any combination of A and B may be utilized. Using these different deposition cycles, it is possible to deposit rare earth oxide films containing different amounts and different depth profiles of the first and second rare earth elements in the resulting mixed rare earth oxide films.

According to another embodiment of the invention, additional pulse sequences containing additional rare earth precursors containing different rare earth elements may be added to the process flow depicted in FIG. 3A to form mixed rare earth oxide films containing three or more different rare earth metal elements. In other words, additional rare earth elements may be incorporated into the films by adding pulse sequences containing a gas pulse of a rare earth precursor and gas pulse of an oxygen-containing gas for each additional rare earth metal element to be incorporated into the film. In one example, a pulse sequence C containing a gas pulse of a third rare earth precursor and a gas pulse of an oxygen-containing gas may be added. Thus, one deposition cycle can, for example, include ABC, ABBC, ABCC, etc. However, embodiments of the invention are not limited to these deposition cycles, as other combinations of A, B, and C may be utilized.

Figure 3B:
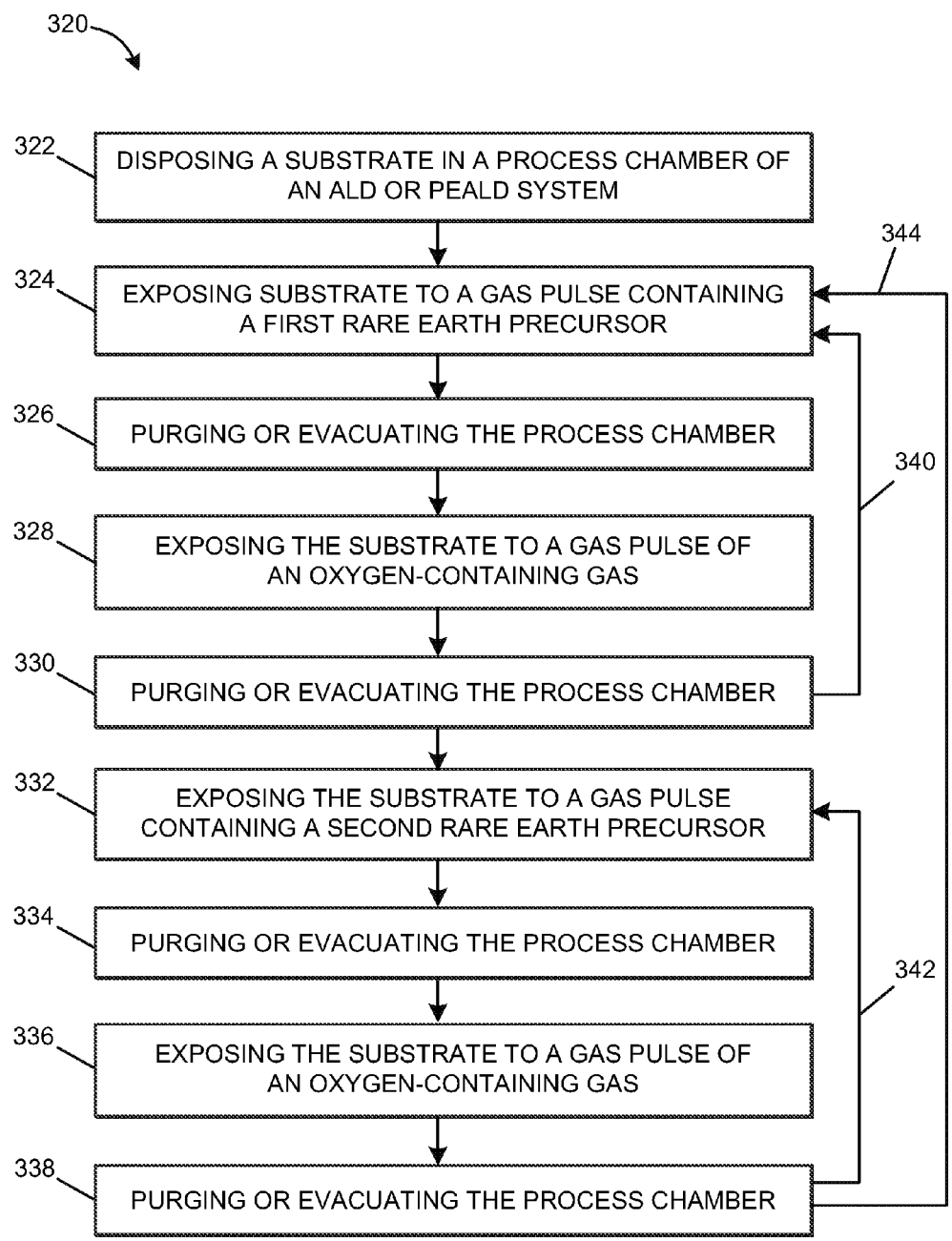

FIG. 3B is a process flow diagram for forming a mixed rare earth oxide film according to another embodiment of the invention. The process flow 320 is similar to the process flow 300 of FIG. 3A, but process flow 320 further includes steps of purging or evacuating the process chamber after each gas pulse. The purging or evacuating steps can aid in removing any unreacted rare earth precursor, byproducts, and oxygen-containing gas from the process chamber between the sequential and alternating rare earth precursor and oxygen-containing gas pulses. As used herein, purging steps may further include evacuating the process chamber during the purging.

The process 320 begins when a substrate, such as a semiconductor substrate, is disposed in a process chamber of an ALD or PEALD system in step 322. In step 324, the substrate is exposed to a gas pulse of a first rare earth precursor, and in step 326, the process chamber is purged or evacuated to remove unreacted first rare earth precursor and any byproducts from the process chamber. In step 328, the substrate is exposed to a pulse of an oxygen-containing gas, and in step 330, the process chamber is purged or evacuated to remove any unreacted oxygen-containing gas or byproducts from the process chamber.

In step 332, the substrate is exposed to a gas pulse containing a second rare earth precursor, and in step 334, the process chamber is purged or evacuated to remove any unreacted second rare earth precursor and any byproducts from the process chamber. In step 336, the substrate is exposed to a pulse of an oxygen-containing gas, and in step 338, the process chamber is purged or evacuated to remove any unreacted oxygen-containing gas or byproducts from the process chamber. Analogous to the process flow 300 of FIG. 3A, the exposure steps 324-330 of process flow 320 may be repeated a predetermined number of times, as shown by the process flow arrow 340, and exposure steps 332-338 may be repeated a predetermined number of times, as shown by the process flow arrow 342. According to one embodiment of the invention, the combination of exposure steps 324-330 and steps 332-338 may be repeated a predetermined number of times, as shown by the process flow arrow 344.

Figure 3C:
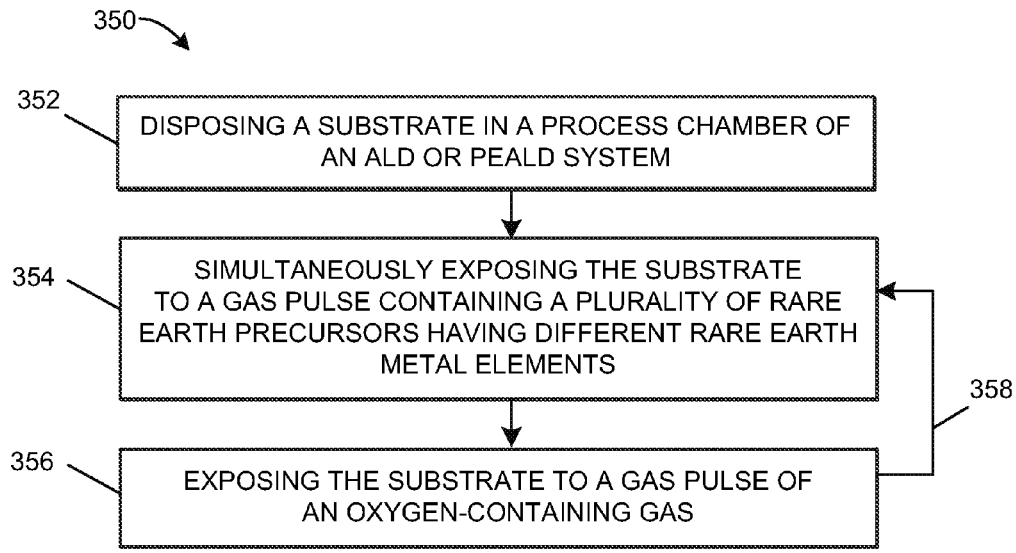

FIG. 3C is a process flow diagram for forming a mixed rare earth oxide film according to yet another embodiment of the invention. As seen in FIG. 3C, the process 350 begins when a substrate, such as a semiconductor substrate, is disposed in a process chamber of an ALD or PEALD system in step 352. In step 354, the substrate is exposed to a gas pulse containing a plurality of, i.e., at least two, rare earth precursors each having a different rare earth metal element. Thus, the gas pulse contains a plurality of different rare earth metal elements to be deposited on the substrate. The relative concentration of each rare earth precursor in the gas pulse may be independently controlled to tailor the composition of the resulting mixed rare earth oxide film. In step 356, the substrate is exposed to a pulse of an oxygen-containing gas. According to one embodiment of the invention, the sequential exposure steps 354 and 356 may be repeated a predetermined number of times as depicted by the process flow arrow 358.

Figure 3D:
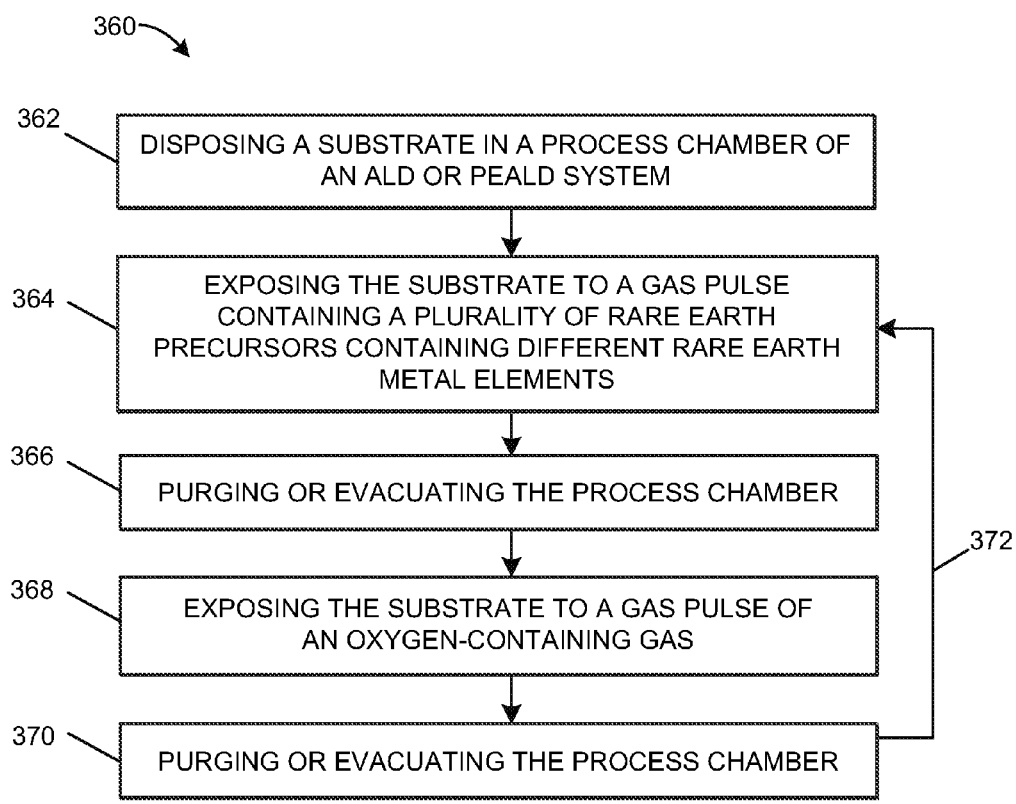

FIG. 3D is a process flow diagram for forming a mixed rare earth oxide film according to still another embodiment of the invention. The process flow 360 is similar to the process flow 350 of FIG. 3C but it also includes steps of purging or evacuating the process chamber after each gas pulse. The process 360 begins when a substrate, such as a semiconductor substrate, is disposed in a process chamber of an ALD or PEALD system in step 362.

In step 364, the substrate is exposed to a gas pulse containing a plurality of rare earth precursors each having a different rare earth metal element, and in step 366, the process chamber is purged or evacuated to remove unreacted rare earth precursor and any byproducts from the process chamber. In step 368, the substrate is exposed to a pulse of an oxygen-containing gas, and in step 370, the process chamber is purged or evacuated to remove any excess oxygen-containing gas or byproducts from the process chamber. According to one embodiment of the invention, the sequential exposure steps 364-370 may be repeated a predetermined number of times, as shown by the process flow arrow 372.

Mixed Rare Earth Nitride Films

Figure 4A:
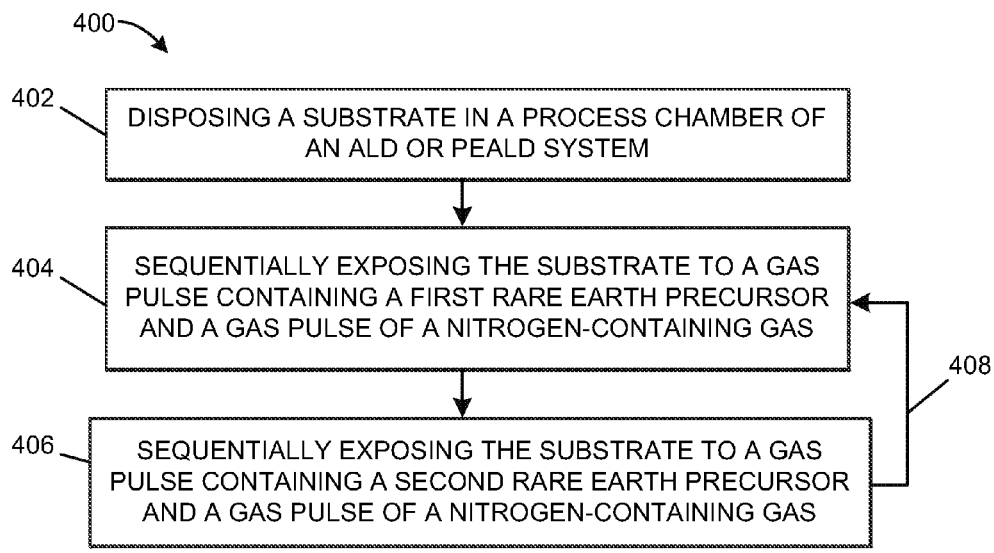
FIGS. 4A-4B are process flow diagrams for forming mixed rare earth nitride films according to embodiments of the invention.
Figure 4B:
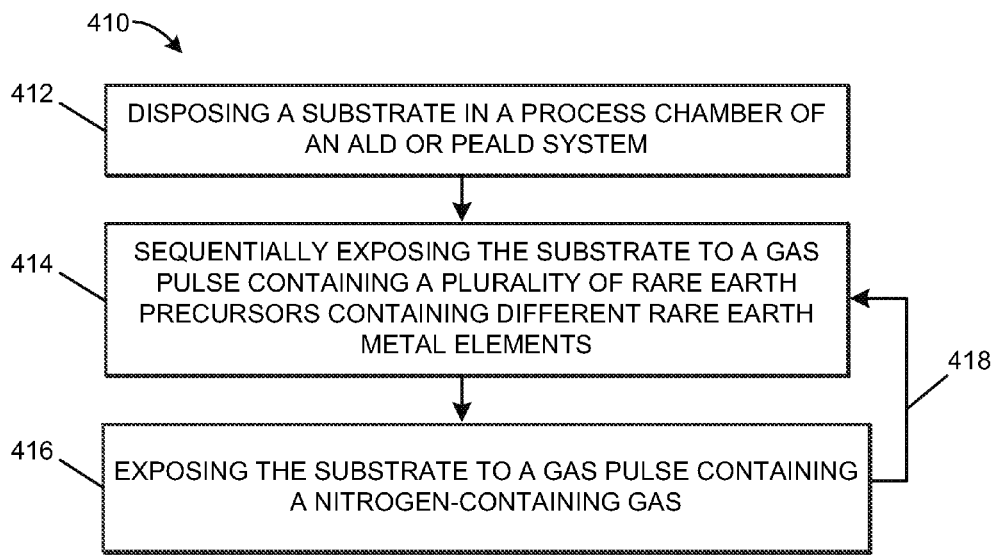

FIGS. 4A-4B are process flow diagrams for forming mixed rare earth nitride films according embodiments of the invention. The process flows of FIG. 4A-4B may be performed by the ALD/PEALD systems 1/101 of FIGS. 1, 2, or any other suitable ALD/PEALD systems configured to perform an ALD/PEALD process.

In FIG. 4A, the process 400 begins when a substrate, such as a semiconductor substrate, is disposed in a process chamber of an ALD or PEALD system in step 402. In step 404, the substrate is sequentially exposed to a gas pulse containing a first rare earth precursor and a gas pulse of a nitrogen-containing gas. In step 406, the substrate is sequentially exposed to a gas pulse of a second rare earth precursor and a gas pulse of a nitrogen-containing gas. The nitrogen-containing gas can contain $NH_3$, $N_2H_4$, plasma excited nitrogen, or a combination thereof, and optionally an inert gas such as Ar.

According to embodiments of the invention, the first rare earth (RE1) precursor and the second rare earth (RE2) precursor contain different rare earth metal elements for forming mixed rare earth nitride films with a general chemical formula $RE1_xRE2_yN_n$, where x, y, and n are non-zero numbers. The sequential exposure steps 404 and 406 may be repeated a predetermined number of times, as shown by the process flow arrow 408, until a mixed rare earth nitride film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to embodiments of the invention, the first rare earth (RE1) precursor and the second rare earth (RE2) precursor contain different rare earth metal elements for forming mixed rare earth nitride films with a general chemical formula $RE1_xRE2_yN_n$, where x, y, and n are non-zero numbers. The sequential exposure steps 404 and 406 may be repeated a predetermined number of times, as shown by the process flow arrow 408, until a mixed rare earth nitride film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to the embodiment depicted in FIG. 4A, the process flow 400 includes a deposition cycle containing sequential and alternating exposures of a pulse of a first rare earth precursor, a pulse of a nitrogen-containing gas, a pulse of a second rare earth precursor, and a pulse of a nitrogen-containing gas. According to one embodiment of the invention, the process flow 400 may contain steps 404, 406, 408 in any order. According to another embodiment of the invention, the order of the sequential and alternating exposure steps 404 and 406 of the deposition cycle be reversed, i.e., step 406 performed before steps 404 to effect film growth and film composition.

According to one embodiment of the invention, each of the sequential exposure steps 404 and 406 may be independently repeated a predetermined number of times. In one example, if step 404 is denoted by pulse sequence A and step 406 is denoted by a pulse sequence B, a deposition cycle can include AB where AB may be repeated a predetermined number of times (i.e., ABABAB etc.) until the desired film is formed. As those skilled in the art will readily recognize, a wide variety of other deposition cycles are possible including, for example, ABBABB, AABAAB, ABBB, AAAB, AABB, AAABB, etc. However, embodiments of the invention are not limited to these deposition cycles, as other combinations of A and B may be utilized. Using these different deposition cycles, it is possible to deposit rare earth nitride films containing different amounts and different depth profiles of the first and second rare earth elements in the resulting mixed rare earth nitride films.

According to another embodiment of the invention, additional pulse sequences containing additional rare earth precursors containing different rare earth elements may be added to the process flow depicted in FIG. 4A to form mixed rare earth nitride films containing three or more different rare earth metal elements. In other words, additional rare earth elements may be incorporated into the films by adding pulse sequences containing sequential exposures of a gas pulse of a rare earth precursor and a gas pulse of a nitrogen-containing gas for each additional rare earth metal element to be incorporated into the film. In one example, a pulse sequence C containing a gas pulse of a third rare earth precursor and a gas pulse of a nitrogen-containing gas may be added. Thus, one deposition cycle can, for example, include ABC, ABBC, ABCC, etc. However, embodiments of the invention are not limited to these deposition cycles, as other combinations of A, B, and C may be utilized.

According to another embodiment of the invention, the process flow 400 may further include steps of purging or evacuating the process chamber after each gas pulse, analogous to the process flow 320 of FIG. 3B. The purging or evacuating steps can aid in removing any unreacted rare earth precursor, byproducts, and nitrogen-containing gas from the process chamber between the alternating rare earth precursor and nitrogen-containing gas pulses.

FIG. 4B is a process flow diagram for forming a mixed rare earth nitride film according to yet another embodiment of the invention. As seen in FIG. 4B, the process 410 begins when a substrate, such as a semiconductor substrate, is disposed in a process chamber of an ALD or PEALD system in step 412.

In step 414, the substrate is exposed to a gas pulse containing a plurality of rare earth precursors each having a different rare earth metal element. Thus, the gas pulse contains a plurality of different rare earth metal elements to be deposited on the substrate. The relative concentration of each rare earth precursor in the gas pulse may be independently controlled to tailor the composition of the resulting mixed rare earth nitride film. In step 416, the substrate is exposed to a pulse of a nitrogen-containing gas. According to one embodiment of the invention, the sequential exposure steps 414 and 416 may be repeated a predetermined number of times as depicted by the process flow arrow 418.

According to another embodiment of the invention, the process flow 410 may further include steps of purging or evacuating the process chamber after each gas pulse, analogous to the process flow 360 of FIG. 3D. The purging or evacuating steps can aid in removing any unreacted rare earth precursor, byproducts, and nitrogen-containing gas from the process chamber between the alternating gas pulses.

Mixed Rare Earth Oxynitride Films

Figure 5A:
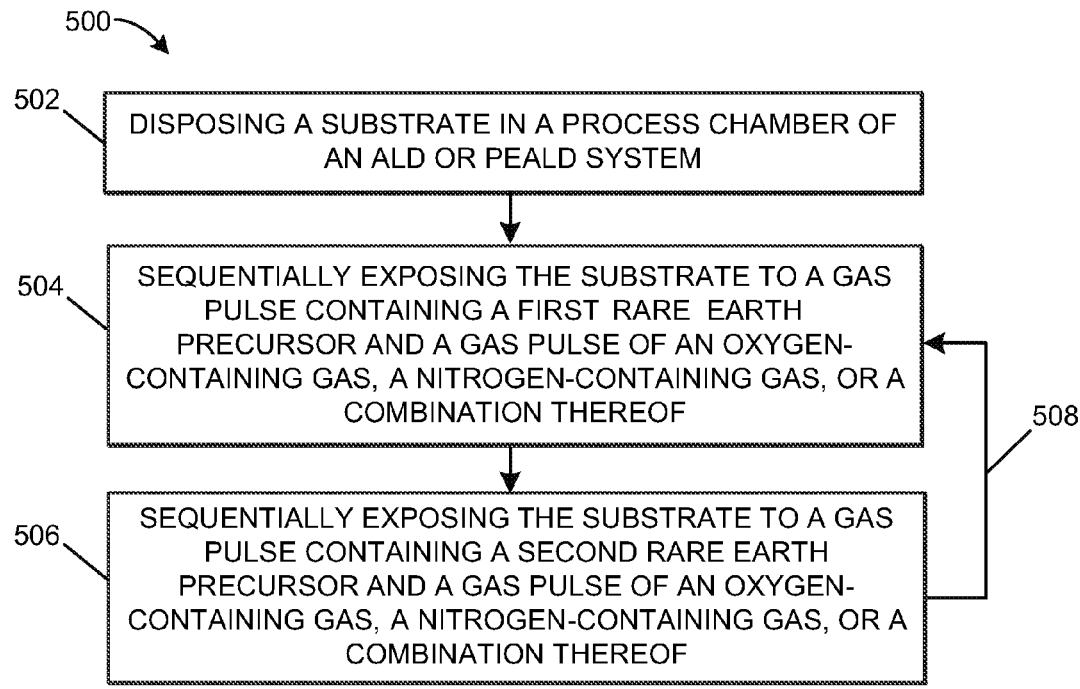
FIGS. 5A-5B are process flow diagrams for forming mixed rare earth oxynitride films according to embodiments of the invention.
Figure 5B:
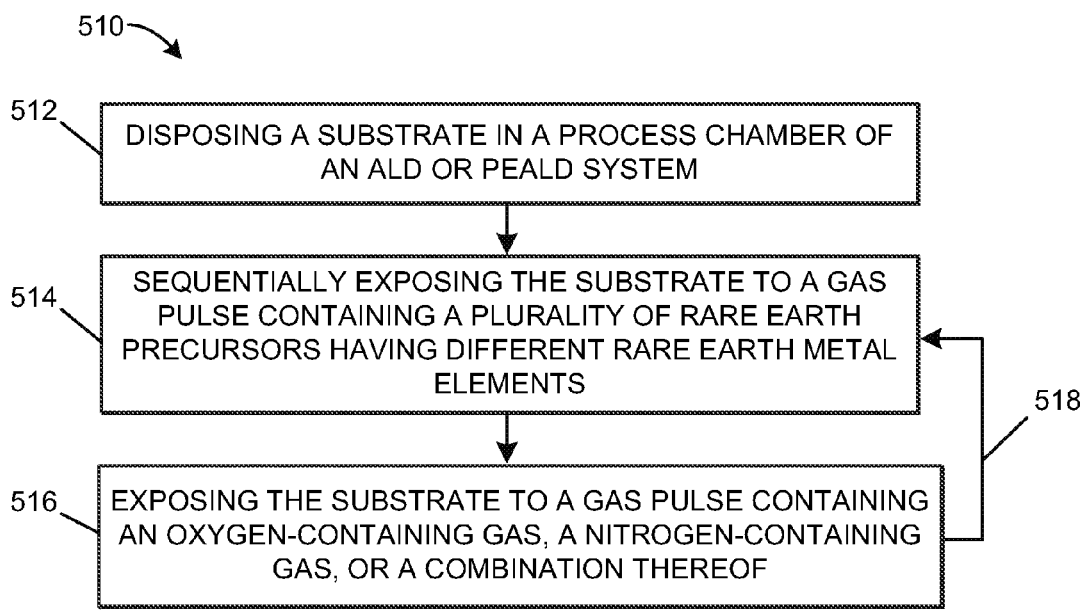

FIGS. 5A-5B are process flow diagrams for forming mixed rare earth oxynitride films according to embodiments of the invention. The process flows of FIG. 5A-5B may be performed by the ALD/PEALD systems 1/101 of FIGS. 1, 2, or any other suitable ALD/PEALD systems configured to perform an ALD/PEALD process.

In FIG. 5A, the process 500 begins when a substrate, such as a semiconductor substrate, is disposed in a process chamber of an ALD or PEALD system in step 502. In step 504, the substrate is sequentially exposed to a gas pulse containing a first rare earth precursor and a gas pulse of an oxygen-containing gas, a nitrogen-containing gas, or an oxygen and nitrogen-containing gas. In step 506, the substrate is sequentially exposed to a gas pulse of a second rare earth precursor and a gas pulse of an oxygen-containing gas, a nitrogen-containing gas, or an oxygen and nitrogen-containing gas. The oxygen-containing gas can include $O_2$, $H_2O$, $H_2O_2$, NO, $NO_2$, $N_2O$, ozone, or plasma excited oxygen, or a combination thereof, and optionally an inert gas such as Ar. The nitrogen-containing gas can contain $NH_3$, $N_2H_4$, NO, $NO_2$, $N_2O$, plasma excited nitrogen, or a combination thereof, and optionally an inert gas such as Ar. In order to incorporate oxygen and nitrogen into the film, the combination of steps 504 and 506 should include at least one gas pulse containing oxygen and at least one gas pulse containing nitrogen. Of course, gases that include NO, $NO_2$, or $N_2O$, contain both oxygen and nitrogen.

According to embodiments of the invention, the first rare earth (RE1) precursor and the second rare earth (RE2) precursors contain different rare earth metal elements for forming mixed rare earth oxynitride films with a general chemical formula $RE1_x RE2_y O_m N_n$, where x, y, m, and n are non-zero numbers. The sequential exposure steps 504 and 506 may be repeated a predetermined number of times, as shown by the process flow arrow 508, until a mixed rare earth oxynitride film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to the embodiment depicted in FIG. 5A, the process flow 500 includes a deposition cycle containing sequential and alternating exposures of a pulse of a first rare earth precursor, a pulse of an oxygen-, nitrogen- or oxygen and nitrogen-containing gas, a pulse of a second rare earth precursor, and a pulse of an oxygen-, nitrogen- or oxygen and nitrogen-containing gas. According to another embodiment of the invention, the order of the sequential and alternating exposure steps 504 and 506 may be reversed, i.e., step 506 performed before step 504, to effect film growth and film composition According to one embodiment of the invention, each of the sequential exposure steps 504 and 506 may be independently repeated a predetermined number of times. In one example, if step 504 is denoted by pulse sequence A and step 506 is denoted by a pulse sequence B, a deposition cycle can include AB where AB may be repeated a predetermined number of times (i.e., ABABAB etc.) until the desired film is formed. As those skilled in the art will readily recognize, a wide variety of other deposition cycles are possible including, for example, ABBABB, AABAAB, ABBB, AAAB, AABB, AAABB, etc. However, embodiments of the invention are not limited to these deposition cycles, as other combinations of A and B may be utilized. Using these different deposition cycles, it is possible to deposit rare earth oxynitride films containing different amounts and different depth profiles of the first and second rare earth metal elements, oxygen, and nitrogen in the resulting mixed rare earth oxynitride film.

According to another embodiment of the invention, additional pulse sequences containing additional rare earth precursors containing different rare earth metal elements may be added to the process flow depicted in FIG. 5A to form mixed rare earth oxynitride films containing three or more different rare earth metal elements. In other words, additional rare earth elements may be incorporated into the films by adding pulse sequences containing a gas pulse of a rare earth metal precursor and a gas pulse of an oxygen-, nitrogen- or oxygen and nitrogen-containing gas for each additional rare earth metal element to be incorporated into the film. In one example, a pulse sequence C containing a gas pulse of a third rare earth precursor and a gas pulse of an oxygen-, nitrogen- or oxygen and nitrogen-containing gas may be added. Thus, one deposition cycle can, for example, include ABC, ABBC, ABCC, etc. However, embodiments of the invention are not limited to these deposition cycles, as other combinations of A, B, and C may be utilized.

According to another embodiment of the invention, the process flow 500 may further include steps of purging or evacuating the process chamber after each gas pulse, analogous to the process flow 320 of FIG. 3B. The purging or evacuating steps can aid in removing any unreacted rare earth precursor, byproducts, oxygen-containing gas, and nitrogen-containing gas from the process chamber between the alternating rare earth precursor, oxygen, and nitrogen-containing gas pulses.

FIG. 5B is a process flow diagram for forming a mixed rare earth oxynitride film according to yet another embodiment of the invention. As seen in FIG. 5B, the process 510 begins when a substrate, such as a semiconductor substrate, is disposed in a process chamber of an ALD or PEALD system in step 512.

In step 514, the substrate is exposed to a gas pulse containing a plurality of rare earth precursors each having a different rare earth metal element. Thus, the gas pulse contains a plurality of, i.e., at least two, different rare earth metal elements to be deposited on the substrate. The relative concentration of each rare earth precursor may be independently controlled to tailor the composition of the resulting mixed rare earth nitride film. In step 516, the substrate is exposed to a pulse of an oxygen-containing gas, a nitrogen-containing gas, or an oxygen and nitrogen-containing gas. According to one embodiment of the invention, the sequential exposure steps 514 and 516 may be repeated a predetermined number of times as depicted by the process flow arrow 518. In order to incorporate oxygen and nitrogen into the film, the combination of steps 514 and 516 should include at least one gas pulse containing oxygen and at least one gas pulse containing nitrogen.

According to another embodiment of the invention, the process flow 510 may further include steps of purging or evacuating the process chamber after each gas pulse, analogous to the process flow 360 of FIG. 3D. The purging or evacuating steps can aid in removing any unreacted rare earth precursor, byproducts, oxygen-containing gas, or nitrogen-containing gas from the process chamber between the alternating gas pulses.

Mixed Rare Earth Aluminate Films

Figure 6A:
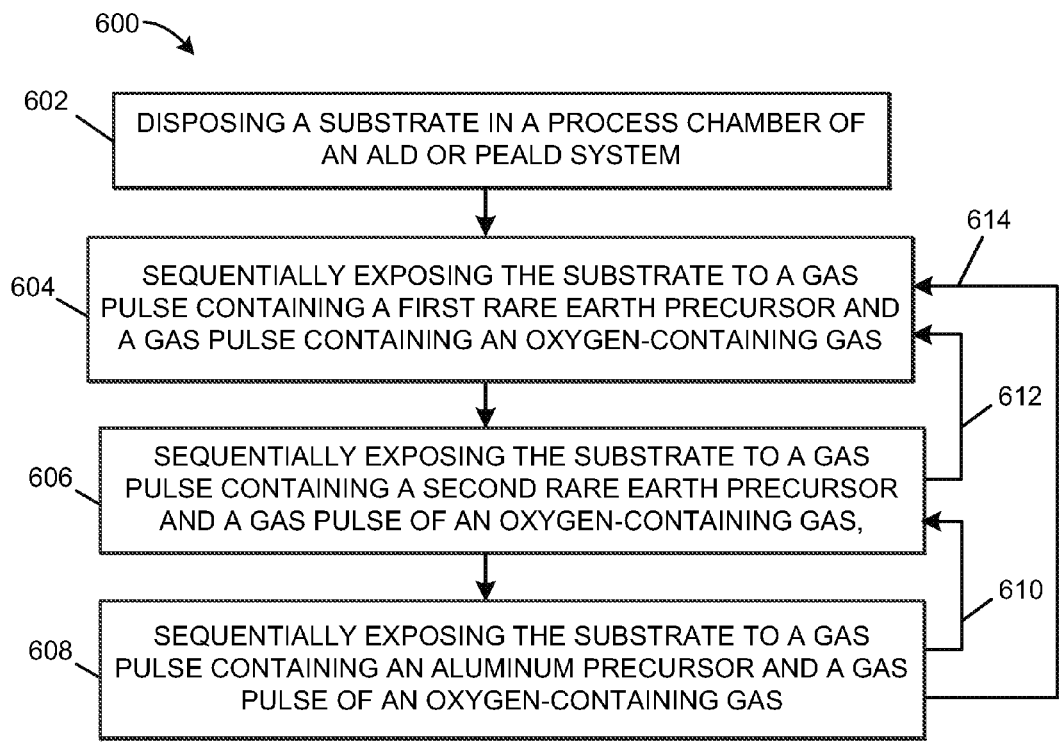
FIGS. 6A-6B are process flow diagrams for forming mixed rare earth aluminate films according to embodiments of the invention.
Figure 6B:
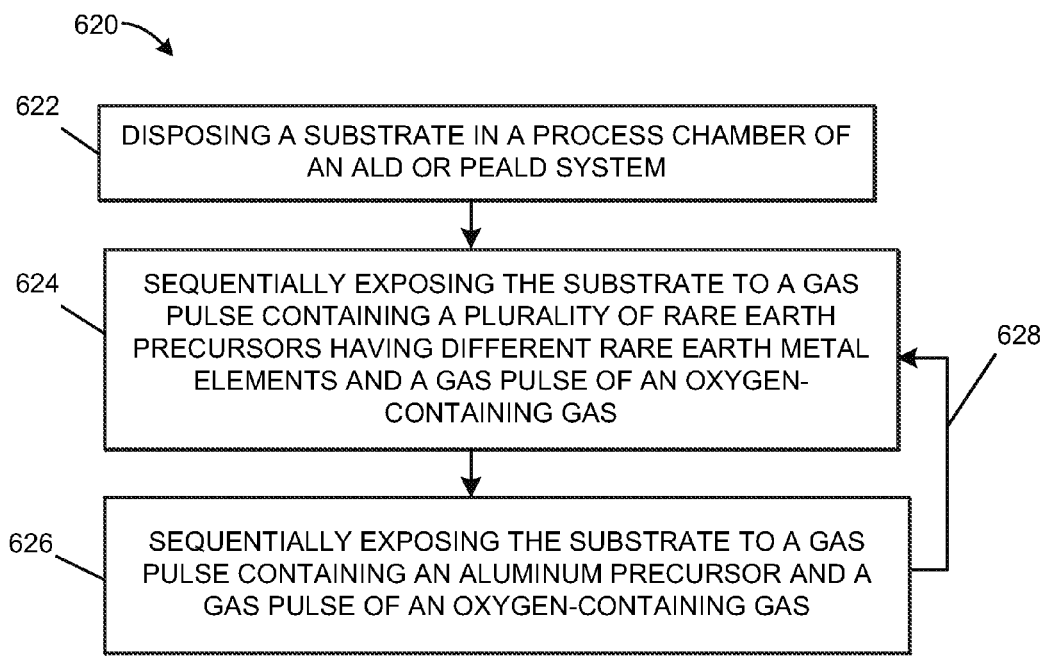

FIGS. 6A-6B are process flow diagrams for forming mixed rare earth aluminate films according embodiments of the invention. The process flows of FIG. 6A-6B may be performed by the ALD/PEALD systems 1/101 of FIGS. 1, 2, or any other suitable ALD/PEALD systems configured to perform an ALD/PEALD process.

In FIG. 6A, the process 600 begins when a substrate, such as a semiconductor substrate, is disposed in a process chamber of an ALD or PEALD system in step 602. In step 604, the substrate is sequentially exposed to a gas pulse of a first rare earth precursor and a gas pulse of an oxygen-containing gas. In step 606, the substrate is sequentially exposed to a gas pulse of a second rare earth precursor and a gas pulse of an oxygen-containing gas. In step 608, the substrate is sequentially exposed to gas pulse of an aluminum precursor and a gas pulse of an oxygen-containing gas. The oxygen-containing gas can include $O_2$, $H_2O$, $H_2O_2$, ozone, or plasma excited oxygen, or a combination thereof, and optionally an inert gas such as Ar.

According to embodiments of the invention, the first rare earth (RE1) precursor and second rare earth (RE2) precursors contain different rare earth metal elements for forming mixed rare earth aluminate films with a general chemical formula $RE1_xRE2_yAl_aO_m$, where x, y, a, and m are non-zero numbers. The sequential exposure steps 604, 606, 608 may be repeated a predetermined number of times, as shown by the process flow arrow 614, until a mixed rare earth aluminate film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to the embodiment depicted in FIG. 6A, the process flow includes a deposition cycle containing sequential and alternating exposures of a pulse of a first rare earth precursor, a pulse of an oxygen-containing gas, a pulse of a second rare earth precursor, a pulse of an oxygen-containing gas, a pulse of an aluminum precursor, and a pulse of an oxygen-containing gas. According to another embodiment of the invention, the order of the sequential and alternating exposure steps 604, 606, 608 of the deposition cycle can be changed to effect film growth and film composition.

According to one embodiment of the invention, each of the sequential exposure steps 604, 606, 608 may be independently repeated a predetermined number of times. In one example, if step 604 is denoted by pulse sequence A, step 606 is denoted by a pulse sequence B, and step 608 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit rare earth aluminate films containing different amounts and different depth profiles of the first and second rare earth elements and aluminum in the resulting mixed rare earth aluminate film.

According to another embodiment of the invention, additional pulse sequences containing additional rare earth precursors containing different rare earth metal elements may be added to the process flow depicted in FIG. 6A to form mixed rare earth aluminate films containing three or more different rare earth metal elements. In other words, additional rare earth elements may be incorporated into the films by adding pulse sequences containing a gas pulse of a rare earth precursor and gas pulse of an oxygen-containing gas for each additional rare earth metal element to be incorporated into the film. In one example, a pulse sequence C containing a gas pulse of a third rare earth precursor and a gas pulse of an oxygen-containing gas may be added. Thus, one deposition cycle can, for example, include ABCX, ABBCX, ABCCX, etc. However, embodiments of the invention are not limited to these deposition cycles, as other combinations of A, B, C, and X may be utilized.

According to another embodiment of the invention, the process flow 600 may further include steps of purging or evacuating the process chamber after each gas pulse. The purging or evacuating steps can aid in removing any unreacted rare earth precursor, byproducts, aluminum precursor, and oxygen-containing gas from the process chamber between the alternating pulses of rare earth precursor, oxygen-containing gas, and aluminum-containing gas.

The exposure steps 604 and 606 may be repeated in sequence a predetermined number of times, as shown by the process flow arrow 612, and exposure steps 606 and 608 may be repeated in sequence a predetermined number of times, as shown by the process flow arrow 610. Furthermore, the exposure steps 604, 606, 608 may be repeated a predetermined number of times as shown by the process arrow 614.

FIG. 6B is a process flow diagram for forming a mixed rare earth aluminate film according to yet another embodiment of the invention. As seen in FIG. 6B, the process 620 begins when a substrate, such as a semiconductor substrate, is disposed in a process chamber of an ALD or PEALD system in step 622.

In step 624, the substrate is sequentially exposed to a gas pulse containing a plurality of rare earth precursors each having a different rare earth metal element and a gas pulse with an oxygen-containing gas. The relative concentration of each rare earth precursor may be independently controlled to tailor the composition of the resulting mixed rare earth aluminate film. In step 626, the substrate is sequentially exposed to a gas pulse of an aluminum precursor and gas pulse of an oxygen-containing gas. According to one embodiment of the invention, the sequential exposure steps 624 and 626 may be repeated a predetermined number of times as depicted by the process flow arrow 628. Furthermore, each of the exposure steps 624 and 626 may be independently repeated a predetermined number of times.

According to another embodiment of the invention, the process flow 620 may further include steps of purging or evacuating the process chamber after each gas pulse. The purging or evacuating steps can aid in removing any unreacted rare earth precursor, byproducts, oxygen-containing gas, and aluminum precursor from the process chamber.

Mixed Rare Earth Aluminum Nitride Films

Figure 7A:
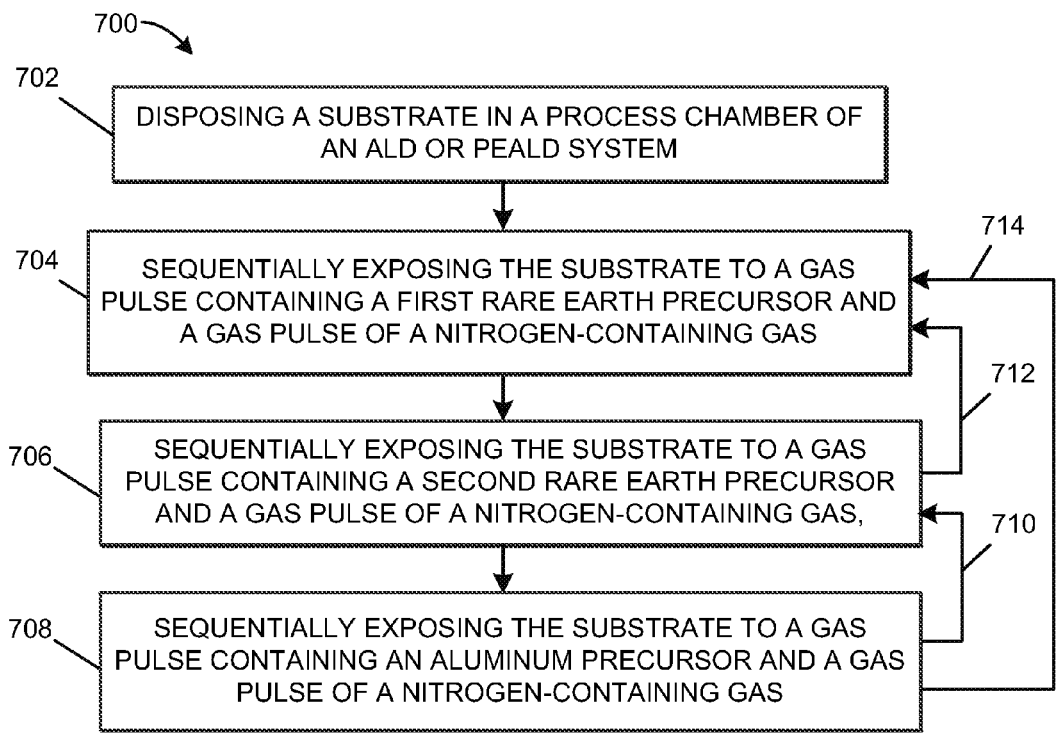
FIGS. 7A-7B are process flow diagrams for forming mixed rare earth aluminum nitride films according to embodiments of the invention.
Figure 7B:
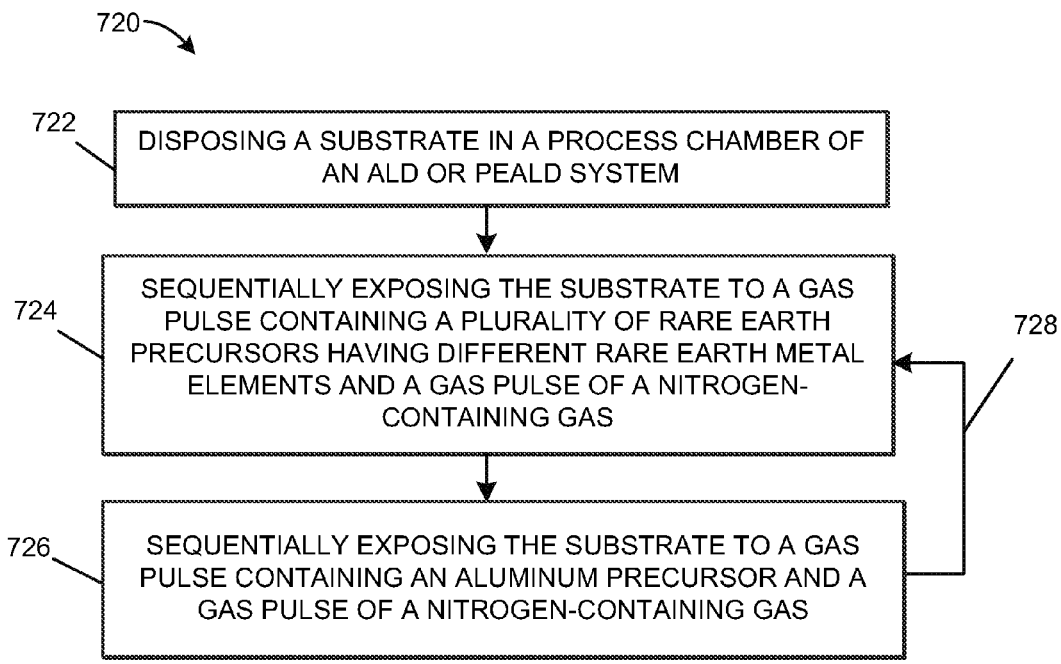

FIGS. 7A-7B are process flow diagrams for forming mixed rare earth aluminate films according embodiments of the invention. The process flows of FIG. 7A-7B may be performed by the ALD/PEALD systems 1/101 of FIGS. 1, 2, or any other suitable ALD/PEALD systems configured to perform an ALD/PEALD process.

In FIG. 7A, the process 700 begins when a substrate, such as a semiconductor substrate, is disposed in a process chamber of an ALD or PEALD system in step 702. In step 704, the substrate is sequentially exposed to a gas pulse containing a first rare earth precursor and a gas pulse of a nitrogen-containing gas. In step 706, the substrate is sequentially exposed to a gas pulse of a second rare earth precursor and a gas pulse of a nitrogen-containing gas. In step 708, the substrate is sequentially exposed to gas pulse of an aluminum precursor and a gas pulse of a nitrogen-containing gas. The nitrogen-containing gas can contain $NH_3$, $N_2H_4$, plasma excited nitrogen, or a combination thereof, and optionally an inert gas such as Ar.

According to embodiments of the invention, the first rare earth (RE1) precursor and second rare earth (RE2) precursors contain different rare earth metal elements for forming mixed rare earth aluminum nitride films with a general chemical formula $RE1_xRE2_yAl_aN_n$, where x, y, a, and n are non-zero numbers The sequential exposure steps 704 and 706 may be repeated a predetermined number of times, as shown by the process flow arrow 712, until a mixed rare earth aluminum nitride film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to the embodiment depicted in FIG. 7A, the process flow includes a deposition cycle containing sequential and alternating exposures of a pulse of a first rare earth precursor, a pulse of a nitrogen-containing gas, a pulse of a second rare earth precursor, a pulse of a nitrogen-containing gas, a pulse of an aluminum precursor, and a pulse of a nitrogen-containing gas. According to another embodiment of the invention, the order of the sequential and alternating exposure steps 704, 706, 708 of the deposition cycle can be changed to effect film growth and film composition.

According to one embodiment of the invention, each of the sequential exposure steps 704, 706, 708 may be independently repeated a predetermined number of times. In one example, if step 704 is denoted by pulse sequence A, step 706 is denoted by a pulse sequence B, and step 708 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit rare earth aluminum nitride films containing different amounts and different depth profiles of the first and second rare earth elements and aluminum in the resulting mixed rare earth aluminum nitride film.

According to another embodiment of the invention, additional pulse sequences containing additional rare earth precursors containing different rare earth elements may be added to the process flow depicted in FIG. 7A to form mixed rare earth aluminum nitride films containing a plurality of different rare earth metal elements. In other words, additional rare earth elements may be incorporated into the films by including additional pulse sequences containing sequential exposures of a gas pulse of a rare earth metal precursor and a gas pulse of a nitrogen-containing gas to each deposition cycle for each desired rare earth element. In one example, a pulse sequence C containing sequential pulses of a third rare earth precursor and a nitrogen-containing gas may be added. Thus, one deposition cycle can, for example, include ABCX, ABBCX, ABCCX, ABCXX, etc. However, embodiments of the invention are not limited to these deposition cycles, as other combinations of A, B, C, and X may be utilized.

According to another embodiment of the invention, additional pulse sequences containing additional rare earth precursors containing different rare earth metal elements may be added to the process flow depicted in FIG. 7A to form mixed rare earth oxide films containing three or more different rare earth metal elements. In other words, additional rare earth elements may be incorporated into the films by adding pulse sequences containing a gas pulse of a rare earth precursor and gas pulse of an oxygen-containing gas for each additional rare earth metal element to be incorporated into the film. In one example, a pulse sequence C containing a gas pulse of a third rare earth precursor and a gas pulse of an oxygen-containing gas may be added. Thus, one deposition cycle can, for example, include ABCX, ABBCX, ABCCX, etc. However, embodiments of the invention are not limited to these deposition cycles, as other combinations of A, B, C, and X may be utilized.

According to another embodiment of the invention, the process flow 700 may further include steps of purging or evacuating the process chamber after each gas pulse. The purging or evacuating steps can aid in removing any unreacted rare earth precursor, byproducts, aluminum precursor, and nitrogen-containing gas from the process chamber between the alternating pulses of rare earth precursor, nitrogen-containing gas, and aluminum-containing gas.

The exposure steps 704 and 706 may be repeated in sequence a predetermined number of times, as shown by the process flow arrow 712, and exposure steps 706 and 708 may be repeated in sequence a predetermined number of times, as shown by the process flow arrow 710. Furthermore, the exposure steps 704, 706, 708 may be repeated a predetermined number of times as shown by the process arrow 714.

FIG. 7B is a process flow diagram for forming a mixed rare earth aluminum nitride film according to yet another embodiment of the invention. As seen in FIG. 7B, the process 720 begins when a substrate, such as a semiconductor substrate, is disposed in a process chamber of an ALD or PEALD system in step 722.

In step 724, the substrate is exposed to a gas pulse containing a plurality of rare earth precursors each having a different rare earth metal element and a gas pulse with a nitrogen-containing gas. The relative concentration of each rare earth precursor may be independently controlled to tailor the composition of the resulting mixed rare earth aluminum nitride film. In step 726, the substrate is sequentially exposed to a pulse of an aluminum precursor and a gas pulse of a nitrogen-containing gas. According to one embodiment of the invention, the sequential exposure steps 724 and 726 may be repeated a predetermined number of times as depicted by the process flow arrow 728.

According to another embodiment of the invention, the process flow 720 may further include steps of purging or evacuating the process chamber after each gas pulse. The purging or evacuating steps can aid in removing any unreacted rare earth precursor, byproducts, nitrogen-containing gas, and aluminum precursor from the process chamber.

Mixed Rare Earth Aluminum Oxynitride Films

Figure 8A:
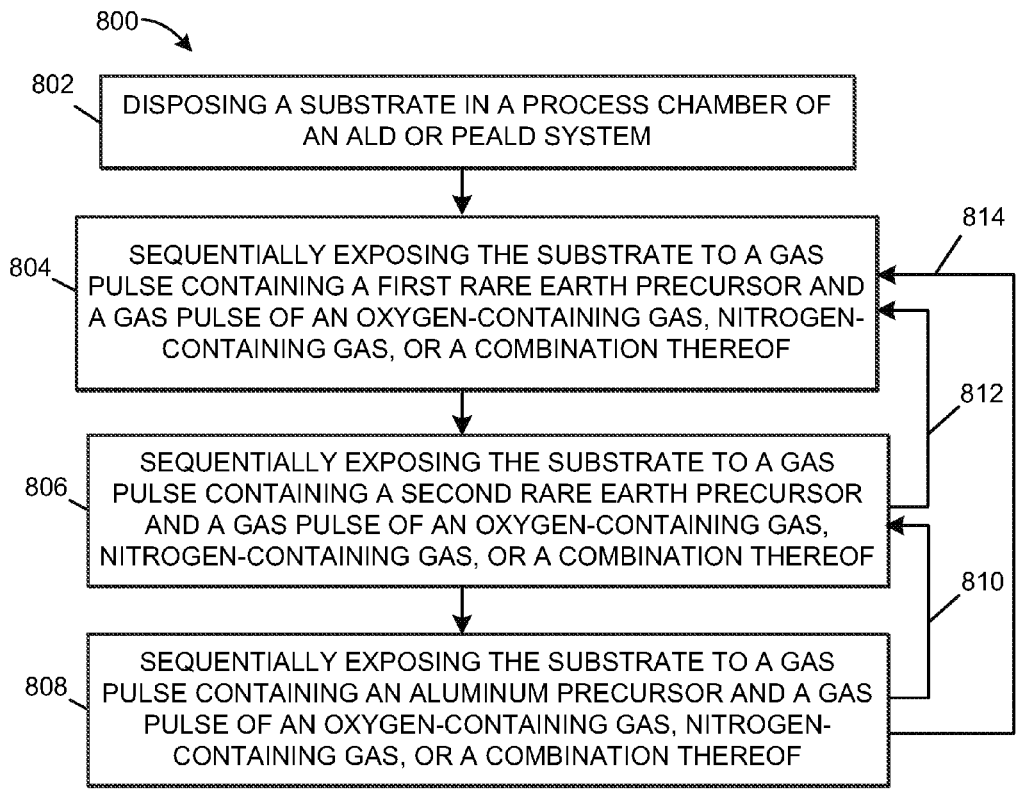
FIGS. 8A-8B are process flow diagrams for forming mixed rare earth aluminum oxynitride films according to embodiments of the invention.
Figure 8B:
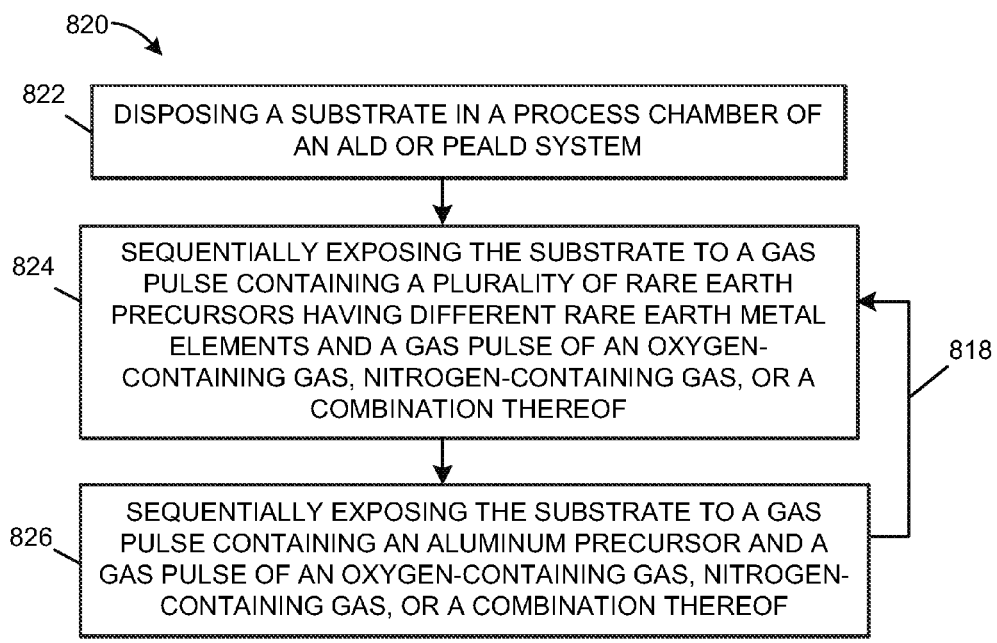

FIGS. 8A-8B are process flow diagrams for forming mixed rare earth aluminum oxynitride films according embodiments of the invention. The process flows of FIG. 8A-8B may be performed by the ALD/PEALD systems 1/101 of FIGS. 1, 2, or any other suitable ALD/PEALD systems configured to perform an ALD/PEALD process.

In FIG. 8A, the process 800 begins when a substrate, such as a semiconductor substrate, is disposed in a process chamber of an ALD or PEALD system in step 802. In step 804, the substrate is sequentially exposed to a gas pulse containing a first rare earth precursor and a gas pulse of an oxygen-containing gas, a nitrogen-containing gas, or an oxygen and nitrogen-containing gas. In step 806, the substrate is sequentially exposed to a gas pulse of a second rare earth precursor and gas pulse of an oxygen-containing gas, a nitrogen-containing gas, or an oxygen and nitrogen-containing gas. In step 808, the substrate is sequentially exposed to gas pulse of an aluminum precursor and a gas pulse of an oxygen-containing gas, a nitrogen-containing gas, or an oxygen and nitrogen-containing gas. The oxygen-containing gas can include $O_2$, $H_2O$, $H_2O_2$, NO, $NO_2$, $N_2O$, ozone, or plasma excited oxygen, or a combination thereof, and optionally an inert gas such as Ar. The nitrogen-containing gas can contain $NH_3$, $N_2H_4$, NO, $NO_2$, $N_2O$, plasma excited nitrogen, or a combination thereof, and optionally an inert gas such as Ar. In order to incorporate oxygen and nitrogen into the film, the combination of steps 804 and 806 should include at least one gas pulse containing oxygen and at least one gas pulse containing nitrogen. Of course, gases that include NO, $NO_2$, or $N_2O$, contain both oxygen and nitrogen.

According to embodiments of the invention, the first rare earth (RE1) precursor and second rare earth (RE2) precursors contain different rare earth metal elements for forming mixed rare earth aluminum oxynitride films with a general chemical formula $RE1_xRE_yAl_aO_mN_n$, where x, y, a, m, and n are non-zero numbers. The sequential exposure steps 804, 806, and 808 may be repeated a predetermined number of times, as shown by the process flow arrow 814, until a mixed rare earth aluminum oxynitride film with a desired thickness has been formed. The desired film thickness can depend on the type of semiconductor device or device region being formed. For example, the film thickness can be between about 5 angstroms and about 200 angstroms, or between about 5 angstroms and about 40 angstroms.

According to the embodiment depicted in FIG. 8A, the process flow includes a deposition cycle containing sequential and alternating exposures of a pulse of a first rare earth precursor, gas pulse of an oxygen-, nitrogen- or oxygen and nitrogen-containing gas, a pulse of a second rare earth precursor, a gas pulse of an oxygen-, nitrogen- or oxygen and nitrogen-containing gas, a pulse of an aluminum precursor, and a gas pulse of an oxygen-, nitrogen- or oxygen and nitrogen-containing gas. According to another embodiment of the invention, the order of the sequential and alternating exposure steps 804, 806, 808 of the deposition cycle can be changed to effect film growth and film composition.

According to one embodiment of the invention, each of the sequential exposure steps 804, 806, 808 may be independently repeated a predetermined number of times. In one example, if step 804 is denoted by pulse sequence A, step 806 is denoted by a pulse sequence B, and step 808 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit rare earth aluminum oxynitride films containing different amounts and different depth profiles of the first and second rare earth elements, aluminum, nitrogen, and oxygen in the resulting mixed rare earth aluminum oxynitride film.

According to another embodiment of the invention, additional pulse sequences containing additional rare earth precursors containing different rare earth elements may be added to the process flow depicted in FIG. 8A to form mixed rare earth aluminum oxynitride films containing three or more different rare earth metal elements. In other words, additional rare earth elements may be incorporated into the films by adding pulse sequences containing sequential exposures of a gas pulse of a rare earth metal precursor and a gas pulse of an oxygen-, nitrogen- or oxygen and nitrogen-containing gas for each additional rare earth metal element to be incorporated into the film. In one example, a pulse sequence C containing a gas pulse of a third rare earth precursor and an oxygen-, nitrogen- or oxygen and nitrogen-containing gas may be added. Thus, one deposition cycle can, for example, include ABCX, ABBCX, ABCCX, ABCXX, etc. However, embodiments of the invention are not limited to these deposition cycles, as other combinations of A, B, C, and X may be utilized. According to another embodiment of the invention, the process flow 800 may further include steps of purging or evacuating the process chamber after each gas pulse. The purging or evacuating steps can aid in removing any unreacted rare earth precursor, byproducts, aluminum precursor, oxygen-containing gas, and nitrogen-containing gas from the process chamber between the alternating pulses of rare earth precursor, oxygen-containing, nitrogen-containing gas, and aluminum-containing gas.

The exposure steps 804 and 806 may be repeated in sequence a predetermined number of times, as shown by the process flow arrow 812, and exposure steps 806 and 808 may be repeated in sequence a predetermined number of times, as shown by the process flow arrow 810. Furthermore, the exposure steps 804, 806, 808 may be repeated a predetermined number of times as shown by the process arrow 814.

FIG. 8B is a process flow diagram for forming a mixed rare earth aluminum oxynitride film according to yet another embodiment of the invention. As seen in FIG. 8B, the process 820 begins when a substrate, such as a semiconductor substrate, is disposed in a process chamber of an ALD or PEALD system in step 822.

In step 824, the substrate is simultaneously exposed to a gas pulse containing a plurality of rare earth precursors each having a different rare earth metal element and a gas pulse with an oxygen-, nitrogen- or oxygen and nitrogen-containing gas. The relative concentration of each rare earth precursor may be independently controlled to tailor the composition of the resulting mixed rare earth oxynitride film. In step 826, the substrate is sequentially exposed to a gas pulse of an aluminum precursor an a gas pulse of an oxygen-, nitrogen- or oxygen and nitrogen-containing gas. According to one embodiment of the invention, the sequential exposure steps 824 and 826 may be repeated a predetermined number of times as depicted by the process flow arrow 828.

According to another embodiment of the invention, the process flow 820 may further include steps of purging or evacuating the process chamber after each gas pulse. The purging or evacuating steps can aid in removing any unreacted rare earth precursor, byproducts, oxygen-containing gas, nitrogen-containing gas, and aluminum precursor from the process chamber.

Figure 9A:
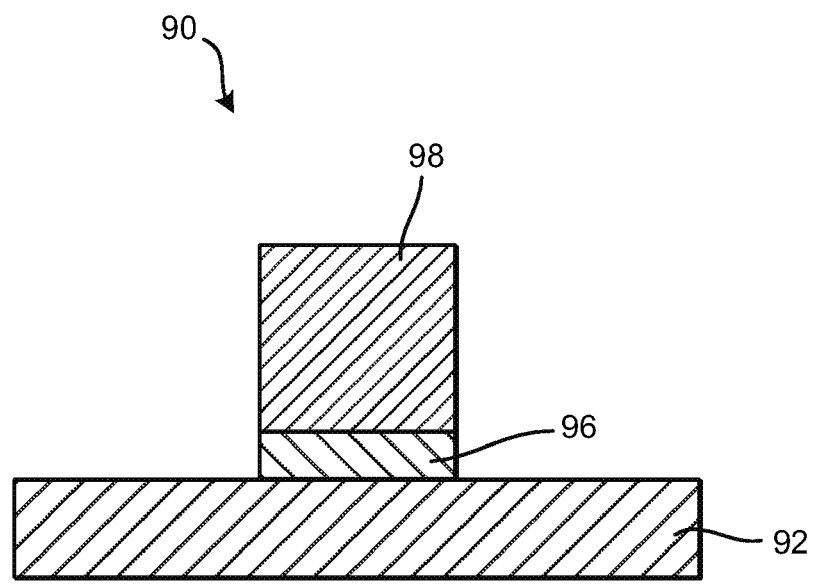
FIGS. 9A and 9B schematically show cross-sectional views of semiconductor devices containing mixed rare earth based materials according to embodiments of the invention.
Figure 9B:
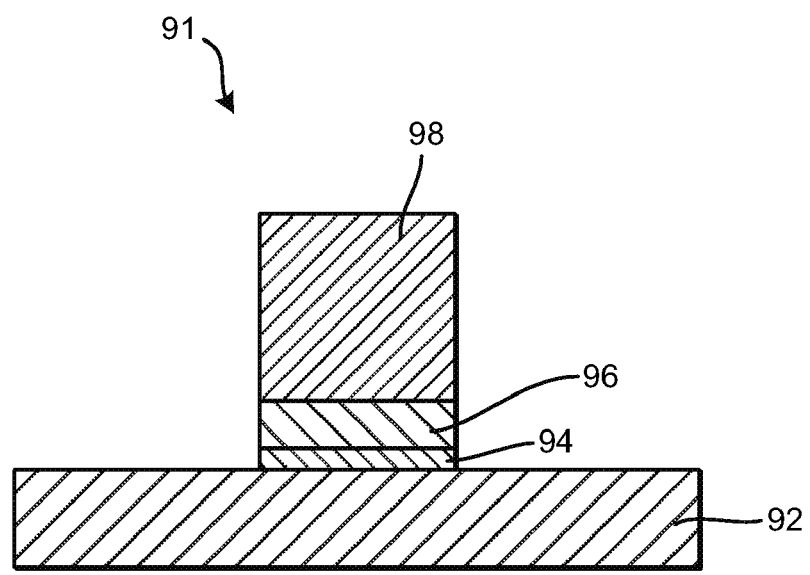

FIGS. 9A and 9B schematically show cross-sectional views of semiconductor devices containing mixed rare earth based materials according to embodiments of the invention. In the schematic cross-sectional views, source and drain regions of the field emission transistors (FET) 90 and 91 are not shown. The FET 90 in FIG. 9A contains a semiconductor substrate 92, a mixed rare earth based film 96 that serves as a gate dielectric, and a conductive gate electrode film 98 over the film 96. The mixed rare earth based film 96 can contain plurality of, i.e., at least two, different rare earth metal elements selected from Y, Lu, La, Ce, Pr, Nd, Sm, Eu, Gd, Tb, Dy, Ho, Er, Tm, and Yb. The mixed rare earth based film 96 can be a mixed rare earth oxide film, a mixed rare earth nitride film, a mixed rare earth oxynitride film, a mixed rare earth aluminate film, mixed rare earth aluminum nitride film, or a mixed rare earth aluminum oxynitride film. A thickness of the mixed rare earth based film 96 can be between about 5 and about 200 angstroms, or between about 5 and about 40 angstroms.

The FET 90 further contains a gate electrode film 98 that can, for example, be between about 5 nm and about 10 nm thick and can contain poly-Si, a metal, or a metal-containing material, including W, WN, $WSi_x$, Al, Mo, Ta, TaN, TaSiN, HfN, HfSiN, Ti, TiN, TiSiN, Mo, MoN, Re, Pt, or Ru.

The FET 91 in FIG. 9B is similar to the FET 90 in FIG. 9A but further contains an interface layer 94 between the mixed rare earth based film 96 and the substrate 92. The interface layer 94 can, for example, be an oxide layer, a nitride layer, or an oxynitride layer.

According to other embodiments of the invention, the semiconductor devices can contain capacitors containing the mixed rare earth based materials.

Although only certain exemplary embodiments of inventions have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming a mixed rare earth oxynitride or mixed rare earth aluminum oxynitride film, comprising:
   disposing a substrate in a process chamber; and
   exposing the substrate to a gas pulse sequence to deposit a mixed rare earth oxynitride film or a mixed rare earth aluminum oxynitride film with a desired thickness, wherein the gas pulse sequence includes, in any order:
   a) sequentially first, exposing the substrate to a gas pulse comprising a first rare earth precursor, and second, exposing the substrate to a gas pulse comprising an oxygen-containing gas, a nitrogen-containing gas, or an oxygen and nitrogen-containing gas;
   b) sequentially first, exposing the substrate to a gas pulse comprising a second rare earth precursor, and second, exposing the substrate to a gas pulse comprising the oxygen-, nitrogen- or oxygen and nitrogen-containing gas, wherein the first and second rare earth precursors contain different rare earth metal elements of differing and mismatched atomic sizes; and
   c) optionally, sequentially first, exposing the substrate to a gas pulse containing an aluminum precursor and second, exposing the substrate to a gas pulse containing the oxygen-, nitrogen- or oxygen and nitrogen-containing gas,
   wherein each of a), b) and optionally c) are optionally repeated a number of times, wherein the gas pulse sequence including a), b) and optionally c) is optionally repeated, in any order, a number of times in order to achieve the desired thickness, and wherein the different rare earth metal elements are in solid solution in the mixed rare earth oxynitride or mixed rare earth aluminum oxynitride film, and wherein the mixed rare earth oxynitride or mixed rare earth aluminum oxynitride film has a dielectric constant that is greater than the dielectric constant of an oxynitride or aluminum oxynitride film having only one of the different rare earth metal elements present in the mixed rare earth oxynitride or mixed rare earth aluminum oxynitride film.

2. The method of claim 1, wherein the rare earth metal elements in the first and second rare earth precursors are selected from Y, Lu, La, Ce, Pr, Nd, Sm, Eu, Gd, Tb, Dy, Ho, Er, Tm, and Yb.

3. The method of claim 1, wherein the oxygen-, nitrogen- or oxygen and nitrogen-containing gases comprise one or more of: $O_2$, $H_2O$, $H_2O_2$, ozone, plasma excited oxygen, NO, $NO_2$, $N_2O$, $NH_3$, $N_2H_4$, or plasma excited nitrogen.

4. The method of claim 1, wherein a) comprises:
alternating the first and second exposing steps a plurality of times.

5. The method of claim 1, wherein b) comprises:
alternating the first and second exposing steps a plurality of times.

6. The method of claim 1, wherein c) comprises:
alternating the first and second exposing steps a plurality of times.

7. The method of claim 1, further comprising purging or evacuating the process chamber after at least one of a), b) or c).

8. The method of claim 1, further comprising purging or evacuating the process chamber between the first and second exposing steps in at least one of a), b) or c).

9. The method of claim 1, further comprising:
performing one or more additional exposure steps, wherein each additional exposure step comprises sequentially first, exposing the substrate to a gas pulse comprising an additional rare earth precursor, and second, exposing the substrate to a gas pulse comprising the oxygen-, nitrogen- or oxygen and nitrogen-containing gas, wherein each additional rare earth precursor contains a different rare earth metal element than the rare earth metal elements in the first and second rare earth precursors.

10. The method of claim 1, wherein the mixed rare earth oxynitride or mixed rare earth aluminum oxynitride film has a thickness between about 5 and about 200 angstroms.

11. The method of claim 1, wherein the first exposing steps in a) and b) are performed concurrently and the second exposing steps in a) and b) are performed concurrently, whereby to sequentially first expose the substrate to a gas pulse comprising both the first and second rare earth precursors, and second expose the substrate to a gas pulse comprising the oxygen-, nitrogen- or oxygen and nitrogen-containing gas.

12. A method for forming a mixed rare earth oxynitride film, comprising:
a) disposing a substrate in a process chamber;
b) exposing the substrate to a gas pulse comprising a plurality of rare earth precursors containing at least two different rare earth metal elements;
c) exposing the substrate to a gas pulse of an oxygen-containing gas, a nitrogen-containing gas, or an oxygen and nitrogen-containing gas; and
d) repeating steps b) and c) a number of times to deposit a mixed rare earth oxynitride film with a desired thickness, wherein the at least two different rare earth metal elements are of differing and mismatched atomic size and are in solid solution in the mixed rare earth oxynitride film, and wherein the mixed rare earth oxynitride film has a dielectric constant that is greater than the dielectric constant of an oxynitride film having only one of the different rare earth metal elements present in the mixed rare earth oxynitride film.

13. The method of claim 12, wherein the at least two rare earth metal elements are selected from Y, Lu, La, Ce, Pr, Nd, Sm, Eu, Gd, Tb, Dy, Ho, Er, Tm, Yb.

14. The method of claim 12, wherein the oxygen-, nitrogen- or oxygen and nitrogen-containing gases comprise one or more of: $O_2$, $H_2O$, $H_2O_2$, ozone, plasma excited oxygen, NO, $NO_2$, $N_2O$, $NH_3$, $N_2H_4$, or plasma excited nitrogen.

15. The method of claim 12, further comprising purging or evacuating the process chamber after at least one of the exposing steps.

16. The method of claim 12, wherein the mixed rare earth oxynitride film has a thickness between about 5 and about 200 angstrom.

17. A method for forming a mixed rare earth aluminum oxynitride film, comprising:
a) disposing a substrate in a process chamber;
b) sequentially first, exposing the substrate to a gas pulse comprising a plurality of rare earth precursors containing at least two different rare earth metal elements, and second, exposing the substrate to a gas pulse of an oxygen-containing gas, a nitrogen-containing gas, or an oxygen and nitrogen-containing gas;
c) sequentially first, exposing the substrate to a gas pulse containing an aluminum precursor and second, exposing the substrate to a gas pulse containing the oxygen-, nitrogen- or oxygen and nitrogen-containing gas; and
d) repeating steps b)-c) a number of times to deposit a mixed rare earth aluminum oxynitride film with a desired thickness, wherein the at least two different rare earth metal elements are of differing and mismatched atomic size and are in solid solution in the mixed rare earth aluminum oxynitride film, and wherein the mixed rare earth aluminum oxynitride film has a dielectric constant that is greater than the dielectric constant of an aluminum oxynitride film having only one of the different rare earth metal elements present in the mixed rare earth aluminum oxynitride film.

18. The method of claim 17, wherein the at least two rare earth metal elements are selected from Y, Lu, La, Ce, Pr, Nd, Sm, Eu, Gd, Tb, Dy, Ho, Er, Tm, and Yb.

19. The method of claim 17, wherein the oxygen-, nitrogen- or oxygen and nitrogen-containing gases comprise one or more of: $O_2$, $H_2O$, $H_2O_2$, ozone, plasma excited oxygen, NO, $NO_2$, $N_2O$, $NH_3$, $N_2H_4$, or plasma excited nitrogen.

20. The method of claim 17, further comprising purging or evacuating the process chamber after at least one of b) or c).

21. The method of claim 17, further comprising purging or evacuating the process chamber between the first and second exposing steps in at least one of b) or c).

22. A method for forming a mixed rare earth aluminum oxynitride film, comprising:
a) disposing a substrate in a process chamber;
b) exposing the substrate to a gas pulse comprising a plurality of rare earth precursors containing at least two different rare earth metal elements and containing an aluminum precursor;
c) exposing the substrate to a gas pulse of an oxygen-containing gas, a nitrogen-containing gas, or an oxygen and nitrogen-containing gas;
d) repeating steps b)-c) a number of times to deposit a mixed rare earth aluminum oxynitride film with a desired thickness, wherein the at least two different rare earth metal elements are of differing and mismatched atomic size and are in solid solution in the mixed rare earth aluminum oxynitride film, and wherein the mixed rare earth aluminum oxynitride film has a dielectric constant that is greater than the dielectric constant of an aluminum oxynitride film having only one of the different rare earth metal elements present in the mixed rare earth aluminum oxynitride film.

23. The method of claim 22, wherein the rare earth metal elements are selected from Y, Lu, La, Ce, Pr, Nd, Sm, Eu, Gd, Tb, Dy, Ho, Er, Tm, and Yb.

24. The method of claim 22, wherein the oxygen-, nitrogen- or oxygen and nitrogen-containing gases comprise one or more of: $O_2$, $H_2O$, $H_2O_2$, ozone, plasma excited oxygen, NO, $NO_2$, $N_2O$, $NH_3$, $N_2H_4$, or plasma excited nitrogen.

25. The method of claim 22, further comprising purging or evacuating the process chamber after at least one of the exposing steps.

* * * * *